United States Patent
Chu et al.

(10) Patent No.: US 10,392,518 B2
(45) Date of Patent: Aug. 27, 2019

(54) PASTE MATERIAL, WIRING MEMBER FORMED FROM THE PASTE MATERIAL, AND ELECTRONIC DEVICE INCLUDING THE WIRING MEMBER

(71) Applicants: SAMSUNG ELECTRONICS CO., LTD., Suwon-si (KR); FOUNDATION OF SOONGSIL UNIVERSITY-INDUSTRY COOPERATION, Seoul (KR)

(72) Inventors: Kunmo Chu, Seoul (KR); Byonggwon Song, Seoul (KR); Sunghoon Park, Seoul (KR); Kiyeon Yang, Seongnam-si (KR); Changseung Lee, Yongin-si (KR)

(73) Assignees: SAMSUNG ELECTRONICS CO., LTD., Suwon-si (KR); FOUNDATION OF SOONGSIL UNIVERSITY-INDUSTRY COOPERATION, Seoul (KR)

( * ) Notice: Subject to any disclaimer, the term of this patent is extended or adjusted under 35 U.S.C. 154(b) by 3 days.

(21) Appl. No.: 15/499,376

(22) Filed: Apr. 27, 2017

(65) Prior Publication Data
US 2018/0148584 A1   May 31, 2018

(30) Foreign Application Priority Data
Nov. 30, 2016 (KR) .......................... 10-2016-0162301

(51) Int. Cl.
*H01B 1/22* (2006.01)
*C09D 5/24* (2006.01)
(Continued)

(52) U.S. Cl.
CPC ................ *C09D 5/24* (2013.01); *C09D 7/61* (2018.01); *C09D 7/69* (2018.01); *C09D 7/70* (2018.01);
(Continued)

(58) Field of Classification Search
CPC .... C08K 2201/011; C08K 3/041; C09D 5/24; H01L 24/33; H01L 23/5328;
(Continued)

(56) References Cited

U.S. PATENT DOCUMENTS 5,170,930 A    12/1992  Dolbear et al.
6,624,224 B1 *  9/2003  Misra .................. H01L 23/3736
                                                          257/E23.107
(Continued)

FOREIGN PATENT DOCUMENTS

KR    10-1588132 B1    1/2016
WO    2005096320 A2   10/2005

OTHER PUBLICATIONS

Dae-Hyeong Kim et al; "Materials and noncoplanar mesh designs for integrated circuits with linear elastic responses to extreme mechanical deformations"; PNAS; Dec. 2, 2008; vol. 105; No. 48; pp. 18675-18680; 6 pgs. total.
(Continued)

*Primary Examiner* — Ahmed N Sefer
(74) *Attorney, Agent, or Firm* — Sughrue Mion, PLLC

(57) ABSTRACT

Provided are a paste material, a method of forming the paste material, a wiring member formed from the paste material, and an electronic device including the wiring member. The paste material may include a plurality of liquid metal particles and a polymer binder. The paste material may further include a plurality of nanofillers. At least some of the plurality of nanofillers may each have an aspect ratio equal to or greater than about 3. A content of the plurality of liquid metal particles may be greater than a content of the polymer binder and may be greater than a content of the plurality of nanofillers. The wiring member may be formed by using the paste material, and the wiring member may be used in various electronic devices.

31 Claims, 18 Drawing Sheets

(51) Int. Cl.
| | |
|---|---|
| *C09D 7/40* | (2018.01) |
| *C09D 7/61* | (2018.01) |
| *C09D 183/04* | (2006.01) |
| *H01L 23/00* | (2006.01) |
| *C09D 11/52* | (2014.01) |
| *H01R 13/24* | (2006.01) |
| *H01B 1/24* | (2006.01) |
| *H05K 1/09* | (2006.01) |
| *H01L 23/498* | (2006.01) |
| *H01L 21/48* | (2006.01) |
| *C08K 3/04* | (2006.01) |
| *C08K 3/08* | (2006.01) |
| *C08K 3/10* | (2018.01) |
| *H05K 1/02* | (2006.01) |
| *H05K 1/18* | (2006.01) |

(52) U.S. Cl.
CPC ............ *C09D 11/52* (2013.01); *C09D 183/04* (2013.01); *H01B 1/22* (2013.01); *H01B 1/24* (2013.01); *H01L 21/4867* (2013.01); *H01L 23/49883* (2013.01); *H01L 24/27* (2013.01); *H01L 24/32* (2013.01); *H01L 24/33* (2013.01); *H01R 13/2414* (2013.01); *H05K 1/095* (2013.01); *C08K 3/041* (2017.05); *C08K 3/08* (2013.01); *C08K 3/10* (2013.01); *C08K 2201/001* (2013.01); *C08K 2201/003* (2013.01); *C08K 2201/011* (2013.01); *H01L 24/13* (2013.01); *H01L 24/16* (2013.01); *H01L 24/48* (2013.01); *H01L 2224/13101* (2013.01); *H01L 2224/16225* (2013.01); *H01L 2224/27515* (2013.01); *H01L 2224/29105* (2013.01); *H01L 2224/29191* (2013.01); *H01L 2224/29193* (2013.01); *H01L 2224/3003* (2013.01); *H01L 2224/48091* (2013.01); *H01L 2924/00014* (2013.01); *H01L 2924/10161* (2013.01); *H01L 2924/15159* (2013.01); *H05K 1/028* (2013.01); *H05K 1/189* (2013.01); *H05K 2201/026* (2013.01); *H05K 2201/0323* (2013.01); *H05K 2203/128* (2013.01)

(58) Field of Classification Search
CPC ... H01L 23/53276; H01L 24/09; H01L 24/29; H01B 1/22
See application file for complete search history.

(56) References Cited

U.S. PATENT DOCUMENTS

| | | | |
|---|---|---|---|
| 9,116,145 B2 | 8/2015 | Li et al. | |
| 2005/0228097 A1* | 10/2005 | Zhong | B82Y 30/00 524/430 |
| 2009/0294739 A1 | 12/2009 | Lee et al. | |
| 2013/0244037 A1 | 9/2013 | Hohman et al. | |
| 2014/0131898 A1* | 5/2014 | Shearer | H01L 24/29 257/783 |
| 2015/0129808 A1* | 5/2015 | Mrozek | H01B 1/22 252/503 |
| 2015/0131239 A1 | 5/2015 | Ha et al. | |
| 2016/0027935 A1 | 1/2016 | Naito et al. | |
| 2016/0049227 A1 | 2/2016 | Bottiglio et al. | |
| 2017/0062374 A1* | 3/2017 | Chu | H01L 24/33 |

OTHER PUBLICATIONS

Tsuyoshi Sekitani et al; "Stretchable active-matrix organic light-emitting diode display using printable elastic conductors"; Nature Materials; vol. 8; Jun. 2009; pp. 494-499; 6 pgs. total.

Adam C. Siegel et al; "Microsolidics: Fabrication of Three-Dimensional Metallic Microstructures in Poly (dimethylsiloxane)"; Advanced Materials; 2007; vol. 19; pp. 727-733; 7 pgs. total.

Jangyeok Yoon et al; "Design and Fabrication of Novel Stretchable Device Arrays on a Deformable Polymer Substrate with Embedded Liquid-Metal Interconnections"; Advanced Materials; 2014; vol. 26; pp. 6580-6586; 7 pgs. total.

Mohammad R. Khan et al; "Recapillarity: Electrochemically Controlled Capillary Withdrawal of a Liquid Metal Alloy from Microchannels"; Materials Views; Advanced Functional Materials; 2015; vol. 25; pp. 671-678; 8 pgs. total.

Etienne Palleau et al; "Self-Healing Stretchable Wires for Reconfigurable Circuit Wiring and 3D Microfluidics"; Materials Views; Advanced Materials; 2013; vol. 25; pp. 1589-1592; 4 pgs. total.

Communication dated Apr. 24, 2018, issued by the European Patent Office in counterpart European Application No. 17176974.8.

* cited by examiner

< DRYING AND CURING PROCESS >

(without CNT)

(with CNTs)

PASTE MATERIAL, WIRING MEMBER FORMED FROM THE PASTE MATERIAL, AND ELECTRONIC DEVICE INCLUDING THE WIRING MEMBER

CROSS-REFERENCE TO RELATED APPLICATION

This application claims priority from Korean Patent Application No. 10-2016-0162301, filed on Nov. 30, 2016 in the Korean Intellectual Property Office, the disclosure of which is incorporated herein in its entirety by reference.

BACKGROUND

1. Field

The present disclosure relates to paste materials, methods of manufacturing the paste materials, wiring/interconnection members formed from the paste materials, and electronic devices including the wiring/interconnection members.

2. Description of the Related Art

Recently, interest in flexible devices, foldable devices, and stretchable devices has increased. Flexible devices are those which may be bent without changing the device's length, whereas stretchable devices are those that may be bent and elongated. Such devices are spotlighted as a next-generation technology in various electronic/semiconductor applications as well as display applications.

In order to realize a flexible device, a foldable device, or a stretchable device, the materials used in the substrate and the electrical wiring included in such a device need to be mechanically deformable. Since metal materials such as copper (Cu), gold (Au), or silver (Ag), which is used in the wiring of general electronic devices, is mechanically stiff, it may be difficult to apply such metal materials to a flexible/foldable/stretchable device. In order to realize a flexible/foldable/stretchable device that may maintain its function even when being mechanically deformed, it is necessary to develop a wring/electrode material which is easily deformed in various ways and which has high electrical conductivity and excellent self-recovery characteristics in terms of having the capability to recover from damage including cracks, disconnections, or scratches.

SUMMARY

One or more example embodiments provide paste materials that may be used as materials for wirings/electrodes.

Further, one or more example embodiments provide wiring/electrode materials that are easily mechanically deformed and which have high electrical conductivities and excellent recovery characteristics from damage, such as cracks, disconnection, and scratches.

Further, one or more example embodiments provide are wiring/electrode materials having small resistance changes even when they are mechanically deformed.

Further, one or more example embodiments provide wiring/electrode materials having self-healing properties.

Further, one or more example embodiments provide electronic devices (e.g., flexible devices, foldable devices, or stretchable devices) including electrical connection members formed from the paste materials. Provided are electronic devices (e.g., flexible devices, foldable devices, or stretchable devices) using the wiring/electrode materials.

Further, one or more example embodiments provide methods of preparing the paste materials, methods of manufacturing the electrical connection members by using the paste materials, and methods of manufacturing electronic apparatuses including the electrical connection members.

Additional aspects will be set forth in part in the description which follows and, in part, will be apparent from the description, or may be learned by practice of the presented embodiments.

According to an aspect of an example embodiment, there is provided a paste material including: a plurality of liquid metal particles; a polymer binder mixed with the plurality of liquid metal particles; and a plurality of nanofillers mixed with the plurality of liquid metal particles and the polymer binder, each of the plurality of nanofillers having an aspect ratio equal to or greater than about 3.

A content (wt %) of the plurality of liquid metal particles may be greater than a content (wt %) of the polymer binder and may be greater than a content (wt %) of the plurality of nanofillers.

A content of the plurality of liquid metal particles with respect to a total weight of the plurality of liquid metal particles and the polymer binder may be equal to or greater than about 80 wt %.

A content of the plurality of nanofillers with respect to a total weight of the plurality of liquid metal particles, the polymer binder, and the plurality of nanofillers may be equal to or less than about 3 wt %.

The plurality of liquid metal particles may include at least one from among gallium (Ga), a gallium-indium (Ga—In) alloy, a gallium-indium-tin (Ga—In—Sn) alloy, and a gallium-indium-tin-zinc (Ga—In—Sn—Zn) alloy, for example.

Each of the plurality of liquid metal particles may have a spherical or elliptical shape, and a diameter or a length of each of the plurality of liquid metal particles may range from several μm to hundreds of μm.

The plurality of nanofillers may include at least one from among carbon nanotubes (CNTs), carbon nanofibers (CNFs), graphene flakes, and metal nanowires, for example.

The polymer binder may include at least one from among silicon-based polymer, polyurethane, polyurethane acrylate, acrylate polymer, acrylate terpolymer, and epoxy. The silicon-based polymer may include at least one of polydimethylsiloxane, polyphenylmethylsiloxane, and hexamethyldisiloxane.

At least one of the plurality of liquid metal particles may be a self-healing particle.

According to an aspect of another example embodiment, there is provided an electronic device including an electrical connection member formed from the paste material.

According to an aspect of another example embodiment, there is provided an electronic device including: a device unit and a wiring structure electrically connected to the device unit, wherein the wiring structure includes a plurality of liquid metal particles, a polymer binder mixed with the plurality of liquid metal particles, and a plurality of nanofillers mixed with the plurality of liquid metal particles and the polymer binder, wherein each of the nanofillers has an aspect ratio equal to or greater than about 3. and at least some of the plurality of liquid metal particles contact each other and at least some of the plurality of nanofillers contact at least one of the plurality of liquid metal particles.

The electronic device may be a flexible device, a foldable device, or a stretchable device, and the wiring structure may be a flexible wiring, a foldable wiring, or a stretchable wiring.

A content (wt %) of the plurality of liquid metal particles in the wiring structure may be greater than a content (wt %) of the polymer binder and may be greater than a content (wt %) of the plurality of nanofillers.

A content of the plurality of liquid metal particles with respect to a total weight of the plurality of liquid metal particles and the polymer binder may be equal to or greater than about 80 wt %.

A content of the plurality of nanofillers with respect to a total weight of the plurality of liquid metal particles, the polymer binder, and the plurality of nanofillers may be equal to or less than about 3 wt %.

The plurality of liquid metal particles may include at least one from among gallium (Ga), a gallium-indium (Ga—In) alloy, a gallium-indium-tin (Ga—In—Sn) alloy, and a gallium-indium-tin-zinc (Ga—In—Sn—Zn) alloy, for example.

The plurality of nanofillers may include at least one from among carbon nanotubes (CNTs), carbon nanofibers (CNFs), graphene flakes, and metal nanowires, for example.

At least one of the plurality of liquid metal particles may be a self-healing particle.

The wiring structure may have an electrical conductivity equal to or greater than about 100 S/m.

The plurality of liquid metal particles may form a continuous conductive path from one end to another end of the wiring structure in a longitudinal direction of the wiring structure.

The wiring structure may include a first layer region and a second layer region, wherein the plurality of liquid metal particles in the first layer region has a first density, and the plurality of liquid metal particles in the second layer region has a second density that is less than the first density.

According to an aspect of another example embodiment, there is provided a method of preparing paste including: preparing a solution including a polymer binder; dispersing a plurality of liquid metal particles in the solution; adding, to the solution, a plurality of nanofillers each having an aspect ratio equal to or greater than about 3; and drying a mixed solution including the polymer binder, the plurality of liquid metal particles, and the plurality of nanofillers.

The dispersing of the plurality of liquid metal particles in the solution may include: putting a liquid metal into the solution; stirring the solution in which the liquid metal is included; and performing sonication on the solution.

After the adding of the plurality of nanofillers to the solution, the method may further include performing mechanical dispersion on the solution.

The mechanical dispersion may be optionally performed by using a roll mill.

A content (wt %) of the plurality of liquid metal particles may be greater than a content (wt %) of the polymer binder and may be greater than a content (wt %) of the plurality of nanofillers.

A content of the plurality of liquid metal particles with respect to a total weight of the plurality of liquid metal particles and the polymer binder may be equal to or greater than about 80 wt %.

A content of the plurality of nanofillers with respect to a total weight of the plurality of liquid metal particles, the polymer binder, and the plurality of nanofillers may be equal to or less than about 3 wt %.

According to an aspect of another example embodiment, there is provided a method of manufacturing an electronic device including: forming a device unit; and forming a wiring structure electrically connected to the device unit, wherein the forming of the wiring structure includes: preparing paste by using the method; applying the paste to a substrate in a predetermined shape; and curing a polymer binder of the applied paste.

BRIEF DESCRIPTION OF THE DRAWINGS

The above and/or other aspects will become apparent and more readily appreciated from the following description of example embodiments, taken in conjunction with the accompanying drawings in which.

DETAILED DESCRIPTION

Figure 1:
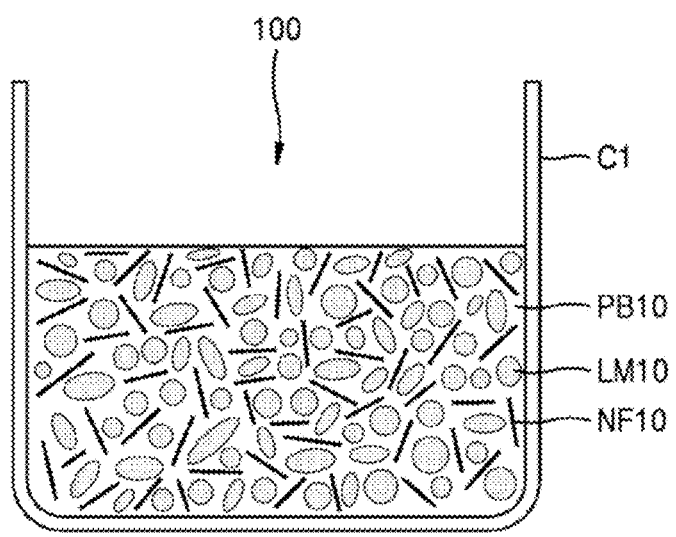
FIG. 1 is a view showing a paste material according to an example embodiment.

Various example embodiments will now be described more fully with reference to the accompanying drawings in which example embodiments are shown.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein the term "and/or" includes any and all combinations of one or more of the associated listed items.

It will be understood that, although the terms "first", "second", etc. may be used herein to describe various elements, components, regions, layers, and/or sections, these elements, components, regions, layers, and/or sections are not limited by these terms. These terms are only used to distinguish one element, component, region, layer, or section from another element, component, region, layer, or section. Thus, a first element, component, region, layer, or section discussed below could be termed a second element, component, region, layer, or section without departing from the teachings of example embodiments.

Spatially relative terms, such as "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an," and "the" are intended to include the plural forms as well, unless the context clearly indicates otherwise. It will be further understood that the terms "comprises," "comprising," "includes," and/or "including" when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result of, for example, manufacturing techniques and/or tolerances, are to be expected. Thus, example embodiments should not be construed as being limited to the particular shapes of regions illustrated herein but should be understood to include deviations in shapes that result from, for example, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

As used herein, the term "and/or" includes any and all combinations of one or more of the associated listed items. Expressions such as "at least one of," when preceding a list of elements, modify the entire list of elements and do not modify the individual elements of the list.

Paste materials, methods of preparing the paste materials, wiring members formed from the paste materials, and electronic devices including the wiring members will now be described more fully with reference to the accompanying drawings, in which embodiments are shown. Widths and thicknesses of layers or regions illustrated in the attached drawings may be exaggerated for clarity and convenience of explanation. The same reference numerals throughout the detailed description denote the same elements.

FIG. 1 is a view showing a paste material according to an example embodiment. The term 'paste material' of the present example embodiment may refer to a material for forming an electrical connection/interconnection member such as a wiring or an electrode.

Referring to FIG. 1, paste 100 may include a plurality of liquid metal particles LM10. The paste 100 may include a polymer binder PB 10 that is mixed with the plurality of liquid metal particles LM10. The paste 100 may further include a plurality of nanofillers NF10 that are mixed with the plurality of liquid metal particles LM10 and the polymer binder PB10.

The plurality of liquid metal particles LM10 may be the main component of the paste 100. In other words, a content (weight percent (wt %)) of the plurality of liquid metal particles LM10 in the paste 100 may be greater than a content (wt %) of the polymer binder PB10 and a content (wt %) of the plurality of nanofillers NF10. For example, a content of the plurality of liquid metal particles LM10 with respect to a total weight of the plurality of liquid metal particles LM10 and the polymer binder PB10 may be equal to or greater than about 70 wt % or about 80 wt %. The content of the plurality of liquid metal particles LM10 with respect to the total weight of the plurality of liquid metal particles LM10 and the polymer binder PB10 may range from about 80 wt % to about 90 wt %. The content of the plurality of nanofillers NF10 with respect to the total weight of the plurality of liquid metal particles LM10, the polymer binder PB10, and the plurality of nanofillers NF10 may be equal to or less than about 5 wt % or about 3 wt %. The content of the plurality of nanofillers NF10 with respect to the total weight of the plurality of liquid metal particles LM10, the polymer binder PB10, and the plurality of nanofillers NF10 may also range from about 0.5 wt % to about 3 wt %.

The plurality of liquid metal particles LM10 may include at least one of, for example, gallium (Ga), a gallium-indium (Ga—In) alloy, a gallium-indium-tin (Ga—In—Sn) alloy, and a gallium-indium-tin-zinc (Ga—In—Sn—Zn) alloy. The Ga—In alloy may be eutectic Gain (i.e., EGaIn), and the Ga—In—Sn alloy may be eutectic GaInSn (i.e., EGaInSn). The liquid metal may be in a liquid state at room temperature (e.g., about 25° C.). For example, since the melting point of the Ga—In alloy may be about 15.3° C., the Ga—In alloy may be in a liquid state at a temperature higher than 15.3° C. The plurality of liquid metal particles LM10 may each have a spherical or elliptical shape, or any of various modified shapes thereof. A diameter or a length of each of the plurality of liquid metal particles LM10 may range from several μm to hundreds of μm, for example, from several μm to tens of μm. For example, a diameter or a length of each of the plurality of liquid metal particles LM10 may range from 1 μm to 500 μm or from 1 μm to 100 μm. At least some of the plurality of liquid metal particles LM10 may contact each other.

At least one of the plurality of liquid metal particles LM10 may be used as a self-healing particle. In other words, at least one of the plurality of liquid metal particles LM10 in a wiring/electrode formed by using the paste 100 may be used as a self-healing (or self-recovery) particle, which will be explained below in more detail with reference to FIGS. 6A and 6B.

The polymer binder PB10 may bind the plurality of liquid metal particles LM10 and the plurality of nanofillers NF10. The polymer binder PB10 may be dissolved in a predetermined solvent. In other words, the polymer binder PB10 may exist as a solution or a gel, and may have fluidity. Accordingly, the polymer binder PB10 may be present along with the predetermined solvent. Also, the polymer binder PB10 may be present along with a predetermined curing agent. The curing agent may be a material for curing the polymer binder PB10. In a process of forming a film or a pattern layer using the paste 100, the polymer binder PB10 may be cured by using the curing agent. The content of the polymer binder PB10 with respect to the total weight of the polymer binder PB10 and the plurality of liquid metal particles LM10 may be equal to or less than about 30 wt % or about 20 wt %. The content of the polymer binder PB10 with respect to the total weight of the polymer binder PB10 and the plurality of liquid metal particles LM10 may also range from about 10 wt % to about 20 wt %.

The polymer binder PB10 may include at least one of, for example, a silicone-based polymer, polyurethane, polyurethane acrylate, an acrylate polymer, an acrylate terpolymer, and epoxy. The silicon-based polymer may include at least one of, for example, polydimethylsiloxane, polyphenylmethylsiloxane, and hexamethyldisiloxane. Polydimethylsiloxane may be abbreviated as "PDMS", polyurethane may be abbreviated as "PU", and polyurethane acrylate may be abbreviated as "PUA". However, a material of the polymer binder PB10 is not limited thereto, and may be changed in various ways. A polymer material used in a flexible device, a foldable device, or a stretchable device may be used as the material of the polymer binder PB10.

Each of the plurality of nanofillers NF10 may include a conductive material. Each of the plurality of nanofillers NF10 may have an aspect ratio equal to or greater than about 3. The term 'aspect ratio' refers to a ratio of length to diameter (e.g., width). Each of the plurality of nanofillers NF10 may have an aspect ratio equal to or greater than about 5 or about 10. As an example, the plurality of nanofillers NF10 may include at least one of carbon nanotubes (CNTs), carbon nanofibers (CNFs), graphene flakes, and metal nanowires. The content of the plurality of nanofillers NF10 with respect to the total weight of the plurality of liquid metal particles LM10, the polymer binder PB10, and the plurality of nanofillers NF10 may be equal to or less than about 5 wt % or about 3 wt %. The plurality of nanofillers NF10 may function as an electrical bridge. In a wiring/electrode formed by using the paste 100, the plurality of nanofillers NF10 may function as a bridge that electrically connects the plurality of liquid metal particles LM10, which will be explained below in more detail with reference to FIGS. 4 and 5.

The paste 100 of FIG. 1 may be liquid metal-based paste including a liquid metal as a main component, or may be a composite paste material or a hybrid nano-paste material. The paste 100 for forming an electrical connection member, such as a wiring member or an electrode, may be a material that is capable of undergoing a patterning process. For example, a wiring member or an electrode may be easily formed by applying the paste 100 to a substrate by using, for example, screen printing or inkjet printing. The wiring member and the electrode formed from the paste 100 may have high flexibility and high bendability, and may also have self-healing/self-recovery characteristics (i.e., reliability). Accordingly, the wiring member and the electrode formed from the paste 100 may have high flexibility, foldability, and/or stretchability. Also, the wiring member and the electrode formed from the paste 100 may have high electrical conductivity. Reference number C1 in FIG. 1 denotes a container in which the paste 100 is stored.

Figure 2A:
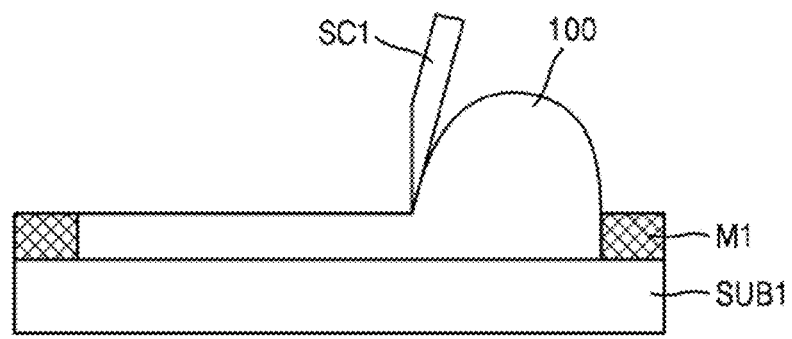
FIGS. 2A through 2C are cross-sectional views showing a method of manufacturing a wiring member by using paste according to an example embodiment.
Figure 2B:
Figure 2C:

FIGS. 2A, 2B and 2C are cross-sectional views showing a method of manufacturing a wiring member by using the paste 100 according to an example embodiment.

Referring to FIG. 2A, a mask pattern M1 having an opening may be located on a substrate SUB1. Next, the paste 100 may be applied to a portion of the substrate SUB1 that is exposed through the opening of the mask pattern M1. For example, when a screen printing process is used, the paste 100 may be applied by being scraped on the mask pattern M1 by using a predetermined scraper SC1. Next, the mask pattern M1 may be removed. The resulting structure is illustrated in FIG. 2B.

Referring to FIG. 2B, a paste layer 100L having a predetermined shape may be formed on the substrate SUB1. The paste layer 100L may be in the shape of a wiring member. The method of forming or applying the paste layer 100L discussed above is exemplary and may be modified in various ways. For example, the paste layer 100L may be formed by using inkjet printing or other methods. The polymer binder PB10 (see FIG. 1) of the paste layer 100L may improve the wetting characteristics of the plurality of liquid metal particles LM10 (see FIG. 1) on the substrate SUB1 and may facilitate a wiring printing (patterning) process.

Referring to FIG. 2C, a drying and curing process may be performed on the paste layer 100L formed on the substrate SUB1. For example, the drying and curing process may be performed at a temperature ranging from about 100° C. to about 150° C. Accordingly, solvent remaining in or on the paste layer 100L following the step shown in FIG. 2B may be removed, and the polymer binder included in the paste layer 100L may be cured. This process may be referred to as a thermal drying and curing process.

Figure 3:
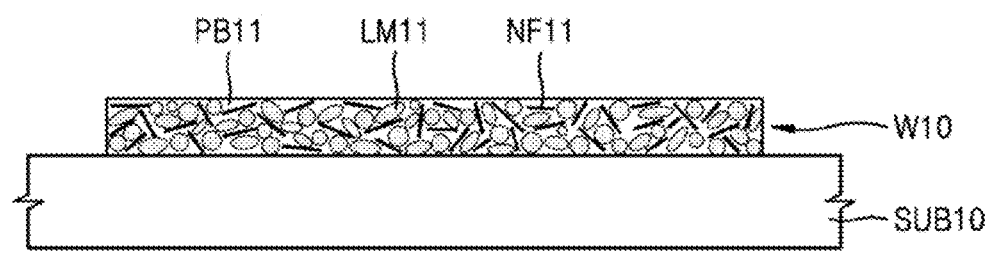
FIG. 3 is a cross-sectional view of a wiring member manufactured using paste, according to an example embodiment.

FIG. 3 is a cross-sectional view of a wiring member W10 manufactured by using paste according to an example embodiment. The structure of FIG. 3 may result from the process of FIGS. 2A through 2C.

Referring to FIG. 3, the wiring member W10 may be provided on a substrate SUB10. The substrate SUB10 may be a flexible substrate, a foldable substrate, or a stretchable substrate. The substrate SUB10 may include a predetermined organic material. For example, the substrate SUB10 may include an elastomeric polymer (e.g., elastic rubber). Any substrate material used in a general flexible, foldable, or stretchable device may be used as the substrate SUB10.

The wiring member W10 may include a plurality of liquid metal particles LM11, a polymer binder PB11 that is mixed with the plurality of liquid metal particles LM11, and a plurality of nanofillers NF11 that are mixed with the plurality of liquid metal particles LM11 and the polymer binder PB11. The plurality of liquid metal particles LM11 may be the same as or similar to the plurality of liquid metal particles LM10 of FIG. 1. The plurality of nanofillers NF11 may be the same as or similar to the plurality of nanofillers NF10 of FIG. 1. The polymer binder PB11 may be obtained by curing the polymer binder PB10 of FIG. 1. The material of the polymer binder PB11 may be the same as or similar to that of the polymer binder PB10 of FIG. 1.

At least some of the plurality of liquid metal particles LM11 may contact each other. The plurality of liquid metal particles LM11 may form a continuous conductive path from one end to the other end of the wiring member W10 in a longitudinal direction of the wiring member W10. In other words, the plurality of liquid metal particles LM11 may be electrically percolated. This may mean that the ratio (i.e., content) of the plurality of liquid metal particles LM11 to other materials present in the wiring member W10 is relatively large. In other words, the main component of the wiring member W10 may be the plurality of liquid metal particles LM11. Also, at least some of the plurality of liquid metal particles LM11 may be granulated so as to have an elliptical shape or the like (e.g., an elongated shape), and thus the percolation threshold may be reduced. In other words, electrical percolation may be easily achieved. Regarding percolation characteristics, the wiring member W10 may have a high electrical conductivity, equal to or greater than about 100 S/m. The electrical conductivity of the wiring member W10 may also be equal to or greater than about 500 S/m or thousands of S/m. Further, at least some of the plurality of nanofillers NF11 may contact at least one of the plurality of liquid metal particles LM11. In some example embodiments, most of the plurality of nanofillers NF11 may contact at least one of the plurality of liquid metal particles LM11. Each of the plurality of nanofillers NF11 may have a high aspect ratio, and may function as an electrical bridge for connecting the liquid metal particles LM11.

A content (wt %) of the plurality of liquid metal particles LM11 in the wiring member W10 may be greater than a content (wt %) of the polymer binder PB11 and a content (wt %) of the plurality of nanofillers NF11. For example, the content of the plurality of liquid metal particles LM11 with respect to the total weight of the plurality of liquid metal particles LM11 and the polymer binder PB11 may be equal to or greater than about 70 or about 80 wt %. Further, the content of the plurality of liquid metal particles LM11 with respect to the total weight of the plurality of liquid metal particles LM11 and the polymer binder PB11 may range from about 80 wt % to about 90 wt %. The content of the plurality of nanofillers NF11 with respect to the total weight of the plurality of liquid metal particles LM11, the polymer binder PB11, and the plurality of nanofillers NF11 may be equal to or less than about 5 wt % or about 3 wt %. Further, the content of the plurality of nanofillers NF11 with respect to the total weight of the plurality of liquid metal particles LM11, the polymer binder PB11, and the plurality of nanofillers NF11 may range from about 0.5 wt % to about 3 wt %.

The plurality of liquid metal particles LM11 may include at least one from among, for example, Ga, a Ga—In alloy, a Ga—In—Sn alloy, and a Ga—In—Sn—Zn alloy. Each of the plurality of liquid metal particles LM11 may have a spherical or elliptical shape, or any of various modified shapes thereof. The diameter or length of each of the plurality of liquid metal particles LM11 may range from several μm to hundreds of μm, for example, from several μm to tens of μm. At least one of the plurality of liquid metal particles LM11 may be used as a self-healing particle. The polymer binder PB11 may include at least one of, for example, a silicone-based polymer, polyurethane, polyurethane acrylate, an acrylate polymer, an acrylate terpolymer, and epoxy. The silicon-based polymer may include at least one of, for example, polydimethylsiloxane, polyphenylmethylsiloxane, and hexamethyldisiloxane. However, the material of the polymer binder PB11 is not limited thereto, and may be changed in various ways. Each of the plurality of nanofillers NF11 may include a conductive material, and may have an aspect ratio equal to or greater than about 3 or about 5. For example, the plurality of nanofillers NF11 may include at least one of CNTs, CNFs, graphene flakes, and metal nanowires.

The plurality of liquid metal particles LM11 and the polymer binder PB11 may constitute one matrix, and the plurality of nanofillers NF11 may be dispersed in the matrix. The plurality of liquid metal particles LM11 in the wiring member W10 may be uniformly (including substantially or relatively uniformly) dispersed, and the plurality of nanofillers NF11 may also be uniformly (including substantially or relatively uniformly) dispersed. The polymer binder PB11 may bind the plurality of liquid metal particles LM11 and the plurality of nanofillers NF11. Also, the polymer binder PB11 may improve wetting characteristics of the plurality of liquid metal particles LM11 on the substrate SUB10. In addition, the polymer binder PB11 may be well-attached to the substrate SUB10, and may provide for a strong adhesive force between the substrate SUB10 and the wiring member W10. Accordingly, the wiring member W10 may not be easily detached from the substrate SUB10 and may be relatively freely deformed along with the substrate SUB10.

Figure 4:
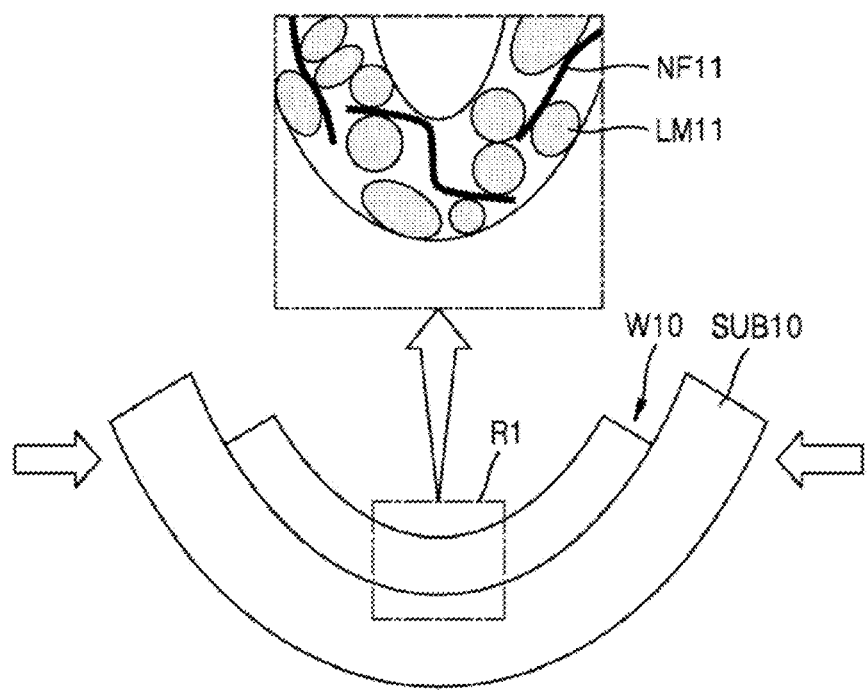
FIG. 4 is a conceptual view showing electrical connection effects of a plurality of nanofillers when a substrate structure including a wiring member is bent, according to an example embodiment.

FIG. 4 is a conceptual view showing electrical connection effects of the plurality of nanofillers NF11 when a substrate substructure including the wiring member W10 is bent, according to an example embodiment.

Referring to FIG. 4, when the substrate SUB10 on which the wiring W10 is formed is bent, disconnection of the wiring W10 at a bent portion R1 may be reduced or prevented as a result of the nanofillers NF11. Each of the nanofillers NF11 may have a relatively high aspect ratio, and may function as an electrical bridge for connecting the plurality of liquid metal particles LM11. Accordingly, even when a direct connection (i.e., contact) between the liquid metal particles LM11 at the bent portion R1 is lost, electrical connection between the liquid metal particles LM11 may be maintained via the nanofillers NF11.

Figure 5:
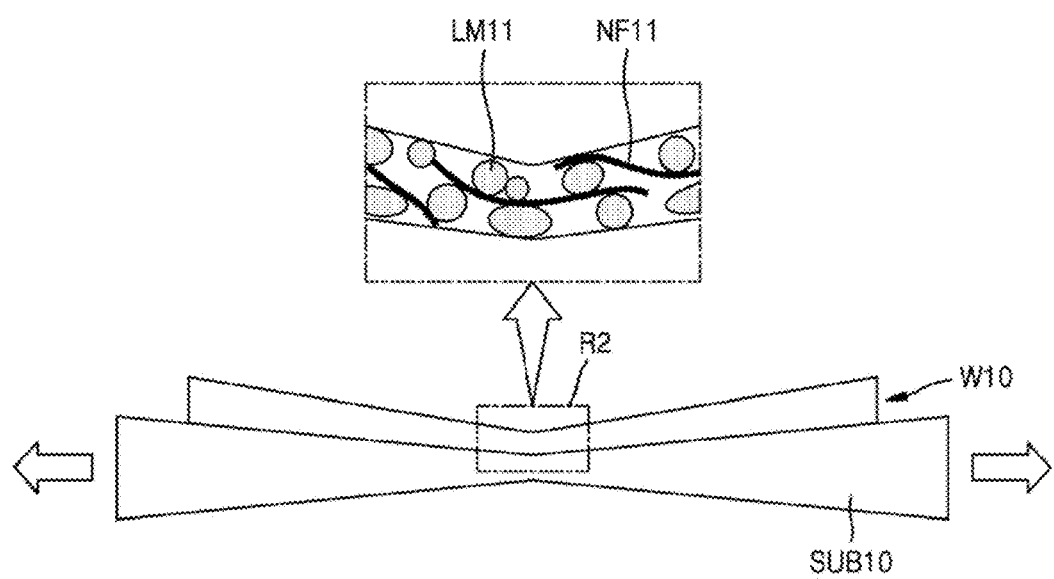
FIG. 5 is a conceptual view showing electrical connection effects of the plurality of nanofillers when a substrate including a wiring member is stretched, according to an example embodiment.

FIG. 5 is a conceptual view showing electrical connection effects of the plurality of nanofillers NF11 when a substrate structure including the wiring member W10 is stretched, according to an example embodiment.

Referring to FIG. 5, when the substrate SUB10 on which the wiring member W10 is formed is stretched, disconnection of the wiring member W10 at a stretched portion R2 may be reduced or prevented as a result of the nanofillers NF11. The stretched portion R2 may be, for example, a central portion of the wiring member W10. Even when a direct connection (i.e., contact) between the liquid metal particles LM11 at the stretched portion R2 is lost, electrical connection between the liquid metal particles LM11 may be maintained via the nanofillers NF11.

As described with reference to FIGS. 4 and 5, when the wiring member W10 is bent or stretched, electrical disconnection of the wiring member W10 may be reduced or prevented as a result of the presence of the plurality of nanofillers NF11, which have a relatively high aspect ratio. Accordingly, when the wiring member W10 is used, an electronic device (e.g., a flexible/foldable/stretchable device) having a high strain and excellent electrical characteristics may be achieved.

Figure 6A:
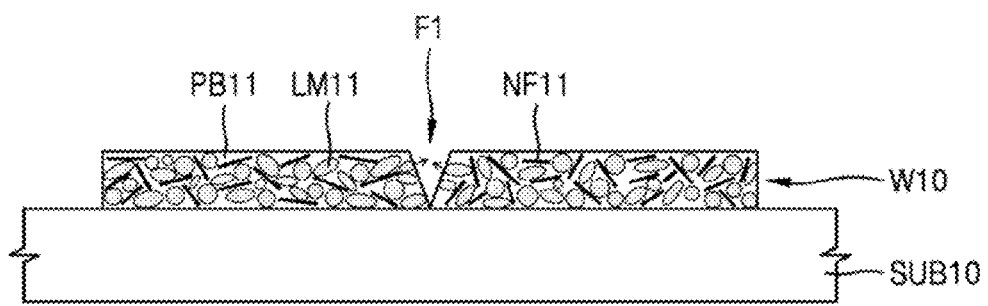
FIGS. 6A and 6B are cross-sectional views showing a self-healing (self-recovery) process of wiring when the wiring member is damaged, according to an example embodiment.
Figure 6B:
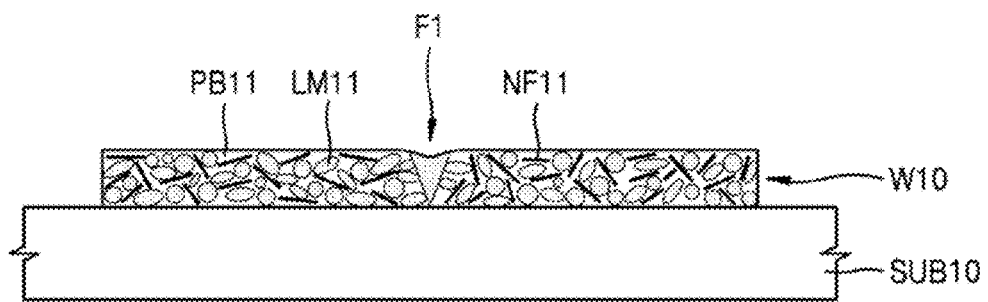

FIGS. 6A and 6B are cross-sectional views showing a self-healing (or self-recovery) process of the wiring member W10 when the wiring member W10 is damaged, according to an example embodiment.

Referring to FIGS. 6A and 6B, when a portion of the wiring member W10 formed on the substrate SUB10 is damaged, in other words, when a damaged portion F1 is formed on the wiring member W10, the liquid metal particles LM11 around the damaged portion F1 may function as self-healing particles. The damaged portion F1 may be a cracked portion or a scratched portion. The wiring member W10 may be healed/recovered as liquid metal flows out from the liquid metal particles LM11 around the damaged portion F1 and fills the damaged portion F1. Accordingly, a portion F1 that is electrically disconnected as a result of damage may be re-connected. A shape and a size (e.g., width and/or depth) of the damaged portion F1 shown in FIGS. 6A and 6B are exemplary only, and may be changed in various ways. For example, the wiring member W10 may be damaged to a predetermined depth and then may be healed/recovered.

In addition, when damaged portion F1 is formed as shown in FIG. 6A, external heat or pressure may be applied to the damaged portion F1 and the healing/recovery process may be expedited as a result of the heat or the pressure. Also, the polymer binder PB11 that is disconnected at the damaged portion F1 may be re-connected as a result of the heat or the pressure. As the degree of damage decreases, that is, as the size of the damaged portion F1 decreases, the healing/recovery process may be performed more rapidly. Also, as the degree of the damage decreases, the recovery rate of physical/electrical characteristics may increase. As such, since the wiring member W10 according to an example embodiment has a self-healing/self-recovery function, the operation reliability of a device including the wiring member W10 may be improved and the device may be easily maintained and/or repaired.

Figure 7:
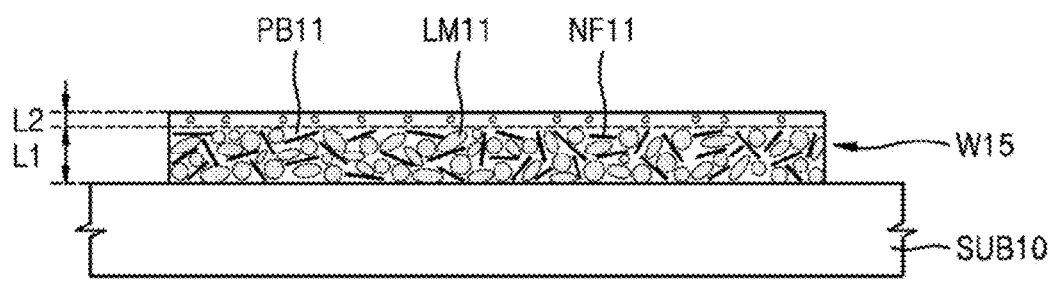
FIG. 7 is a cross-sectional view of a wiring structure according to another example embodiment.

FIG. 7 is a cross-sectional view of a wiring structure according to another example embodiment. The structure of FIG. 7 may result from the process of FIGS. 2A through 2C, and may be different from the structure of FIG. 3.

Referring to FIG. 7, a wiring member W15 may be provided on the substrate SUB10. The wiring member W15 may include a plurality of liquid metal particles LM11, a polymer binder PB11, and a plurality of nanofillers NF11. In this regard, the wiring member W15 may be similar to the wiring W10 of FIG. 3.

The wiring member W15 of the present example embodiment may include a plurality of regions (e.g., L1 and L2) including different densities of liquid metal particles LM11. For example, the wiring member W15 may include a first layer region L1 and a second layer region L2. The first layer region L1 may be closer to the substrate SUB10 than the second layer region L2. Accordingly, the first layer region L1 may be provided between the substrate SUB10 and the second layer region L2. The first layer region L1 may have a first density of liquid metal particles LM11, and the second layer region L2 may have a second density of liquid metal particles LM11 that is less than the first density.

The first layer region L1 may have a configuration and a compositional ratio that are the same as or similar to those of the wiring member W10 of FIG. 3. Accordingly, in the first layer region L1, the content of the plurality of liquid metal particles LM11 with respect to the total weight of the plurality of liquid metal particles LM11 and the polymer binder PB11 may be equal to or greater than about 70 wt % or about 80 wt %, for example, from about 80 wt % to about 90 wt %. Also, in the first layer region L1, the content of the plurality of nanofillers NF11 with respect to the total weight of the plurality of liquid metal particles LM11, the polymer binder PB11, and the plurality of nanofillers NF11 may be equal to or less than about 5 wt % or about 3 wt %, for example, from about 0.5 wt % to about 3 wt %. In the first layer region L1, the plurality of liquid metal particles LM11 may form a continuous conductive path from one end to the other end of the wiring member W15 in a longitudinal direction of the wiring member W15. In other words, the plurality of liquid metal particles LM11 in the first layer region L1 may be electrically percolated.

The particle density, that is, the number of the liquid metal particles LM11 per unit volume, in the second layer region L2 may be less than that in the first layer region L1. Only a small number of liquid metal particles LM11 may exist or few liquid metal particles LM11 may exist in the second layer region L2, or the second layer region L2 may be free or substantially free of liquid metal particles LM11. Also, the size of each of the liquid metal particles LM11 existing in the second layer region L2 may be relatively small. Further, the nanofiller density, that is, the number of the nanofillers NF11 per unit volume, in the second layer region L2 may be less than that in the first layer region L1. Only a small number of nanofillers NF11 may exist or few nanofillers NF11 may exist in the second layer region L2, or the second layer region L2 may be free or substantially free of nanofillers NF11.

The first layer region L1 may substantially function as a wiring portion. In other words, an electrical connection may be made through the first layer region L1. The second layer region L2 may protect the first layer region L1. In other words, the second layer region L2 may function as an encapsulation layer. Accordingly, the first layer region L1 may be protected by the second layer region L2. Also, the liquid metal particles LM11 existing in the second layer region L2 may be used as self-healing particles.

A thickness of the first layer region L1 may be greater than a thickness of the second layer region L2. The thickness of the first layer region L1 may be equal to or greater than several μm or greater than about 10 μm. For example, the thickness of the first layer region L1 may range from tens of μm to several mm. The thickness of the second layer region L2 may be equal to or less than several μm. For example, the thickness of the second layer region L2 may be equal to or less than about 3 μm, for example, about 1 μm. However, the thicknesses of the first layer region L1 and the second layer region L2 are not limited thereto, and may be changed in various ways.

A process of forming the wiring member W15 having a multi-layer structure as shown in FIG. 7 will now be explained briefly. In FIG. 2A, when the content of the polymer binder PB10 (see FIG. 1) in the paste 100 is greater than a predetermined threshold value, the plurality of liquid metal particles LM10 (see FIG. 1) in the paste layer 100L of 2B may be substantially accumulated at the bottom, and the polymer binder PB10 having a relatively low specific gravity may be mainly located in an upper portion of the paste layer 100L. Accordingly, a material layer obtained by mixing the plurality of liquid metal particles LM10, the plurality of nanofillers NF10, and the polymer binder PB10 may be located in a lower portion of the paste layer 100L, and a material layer including a small number of liquid metal particles LM10 and a small number of nanofillers NF10 and mainly including the polymer binder PB10 may be located in the upper portion of the paste layer 100L. Accordingly, a wiring member W15 having a multi-layer structure (e.g., a double-layer structure) as shown in FIG. 7 may be formed from the paste layer 100L.

Once the wiring member W15 having the multi-layer structure (e.g., the double-layer structure) as shown in FIG. 7 is formed, the first layer region L1 that substantially functions as a wiring may be protected by the second layer region L2. The first layer region L1 may be physically, chemically, and electrically protected by the second layer region L2. Accordingly, damage to the first layer region L1 may be suppressed.

Figure 8:
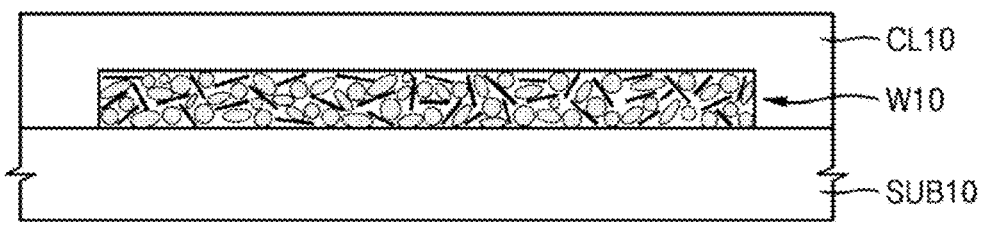
FIG. 8 is a cross-sectional view of a substrate structure including a wiring member, according to another example embodiment.

FIG. 8 is a cross-sectional view of a substrate structure including the wiring member W10 according to another example embodiment.

Referring to FIG. 8, the wiring member W10 according to an example embodiment may be provided on the substrate SUB10, and a capping layer CL10 that covers the wiring member W10 may be further provided on the substrate SUB10. The substrate SUB10 and the wiring member W10 may be substantially the same as or similar to the substrate SUB10 and the wiring member W10 of FIG. 3, respectively. Accordingly, the wiring member W10 may include a plurality of liquid metal particles LM11, a polymer binder PB11, and a plurality of nanofillers NF11. The materials and compositional ratio of the plurality of liquid metal particles LM11, the polymer binder PB11, and the plurality of nanofillers NF11 may be the same as those described with reference to FIG. 3.

The capping layer CL10 may protect the wiring member W10. The capping layer CL10 may physically, chemically, and electrically protect the wiring member W10. In this regard, the capping layer CL10 may be a protective layer. The capping layer CL10 may include an organic material, and may be bent or extended. The capping layer CL10 may include a material that is similar to or the same as that of the substrate SUB10. That is, the capping layer CL10 may include an organic material such as an elastomeric polymer (e.g., elastic rubber). Any of various organic materials used in a general flexible device or a stretchable device may be used in the capping layer CL10.

Figure 9:
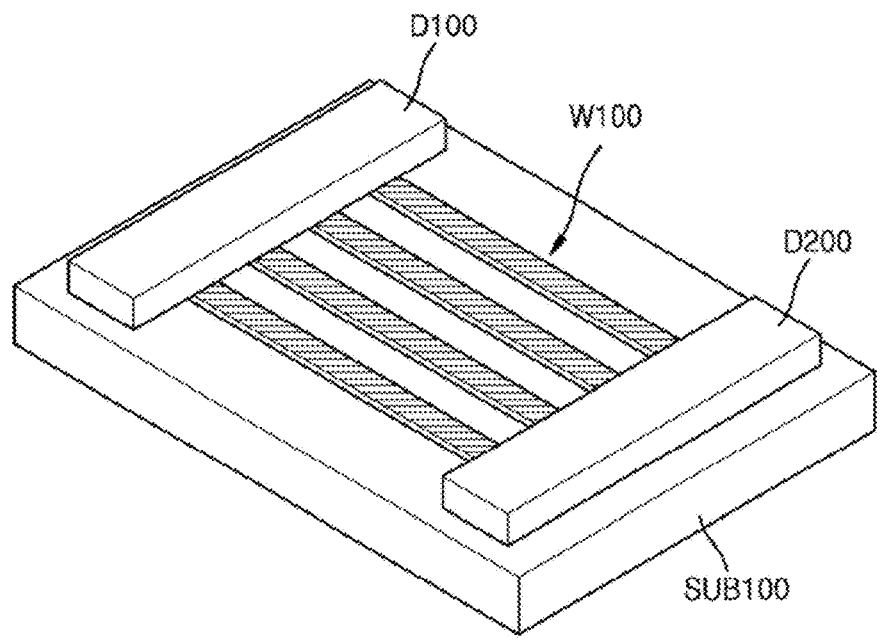
FIG. 9 is a perspective view of an electronic device including a wiring structure, according to an example embodiment.

FIG. 9 is a perspective view of an electronic device including a wiring structure according to an example embodiment.

Referring to FIG. 9, at least one device unit, for example, a first device unit D100 and a second device unit D200, may be provided on a substrate SUB100. At least one wiring member W100 electrically connected to the first device unit D100 and/or the second device unit D200 may be provided on the substrate SUB100. For example, a plurality of the wiring members W100 may be connected to the first device unit D100 and the second device unit D200. The first device unit D100 and the second device unit D200 may be electrically connected through the plurality of wiring members W100.

Each of the plurality of wiring members W100 may have the configuration and characteristics of the wiring members W10 or W15 of FIGS. 3 through 8. The material and compositional ratio of the wiring member W100 may be the same as those of the wiring members W10 or W15 of FIGS. 3 and 7, and thus an explanation of the same is not repeated here. The wiring member W100 may be formed by using the method of FIGS. 2A through 2C using the paste 100 of FIG. 1.

If necessary, a capping layer (e.g., a protective layer) that covers the first and second device units D100 and D200 and the wiring member W100 may be further provided on the substrate SUB100. The capping layer (e.g., the protective layer) may be the same as or similar to the capping layer CL10 of FIG. 8.

Figure 10:
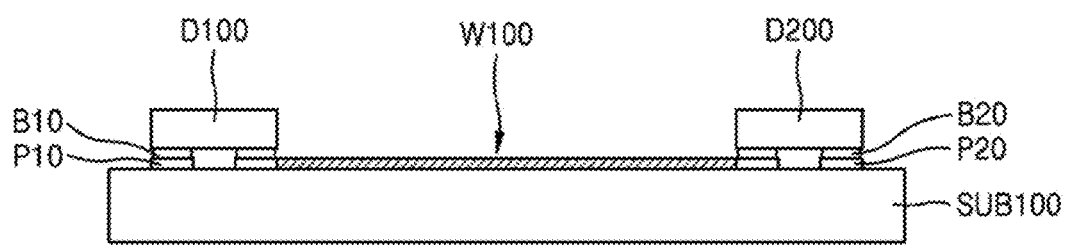
FIG. 10 is a cross-sectional view of the electronic device of FIG. 9.

FIG. 10 is a cross-sectional view of the electronic device of FIG. 9.

Referring to FIG. 10, the first device unit D100 may be provided on the substrate SUB100. A plurality of first electrode pads P10 may be provided on the substrate SUB100 and the first device unit D100 may be attached to the plurality of first electrode pads P10. A plurality of first solder bumps B10 may be provided between the first device unit D100 and the plurality of first electrode pads P10. The second device unit D200 that is spaced apart from the first device unit D100 may be provided on the substrate SUB100. A plurality of second electrode pads P20 may be provided on the substrate SUB100 and the second device unit D200 may be attached to the plurality of second electrode pads P20. A plurality of second solder bumps B20 may be provided between the second device unit D200 and the plurality of second electrode pads P20.

The wiring member W100 that electrically connects the first device unit D100 and the second device unit D200 may be provided on the substrate SUB100. The wiring member W100 may be provided to electrically connect the plurality of first electrode pads P10 and the plurality of second electrode pads P20. The plurality of wiring members W100 may be arranged parallel to one another as shown in FIG. 9.

Figure 11:
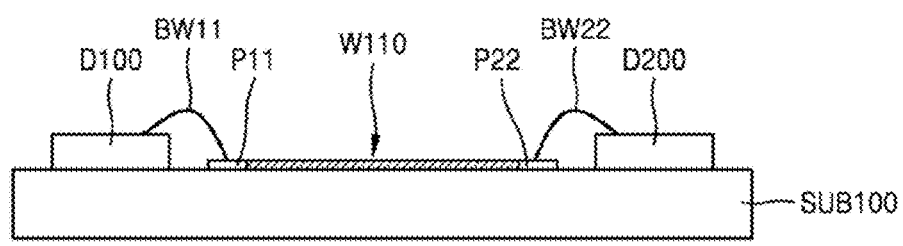
FIG. 11 is a cross-sectional view of an electronic device according to another example embodiment.

A structure of the electronic device of FIGS. 9 and 10 is exemplary, and may be changed in various ways. For example, FIG. 11 illustrates a modification of the structure of FIG. 10. That is, FIG. 11 is a cross-sectional view of an electronic device according to another example embodiment.

Referring to FIG. 11, the first device unit D100 may be provided on the substrate SUB100 and at least one first electrode pad P11 that is spaced apart from the first device unit D100 may be provided. At least one first bonding wire BW11 that connects the first device unit D100 and the first electrode pad P11 may be provided. The second device unit D200 that is spaced apart from the first device unit D100 may be provided on the substrate SUB100, and at least one second electrode pad P22 that is spaced apart from the second device unit D200 may be provided. At least one second bonding wire BW22 that connects the second device unit D200 and the second electrode pad P22 may be provided.

At least one wiring member W110 that electrically connects at least one first electrode pad P11 and at least one second electrode pad P22 may be provided on the substrate SUB100. Although not shown in FIG. 11, a plurality of the wiring members W110 may be arranged parallel to one another. Also, a first adhesive layer may be provided between the substrate SUB100 and the first device unit D100, and similarly, a second adhesive layer may be provided between the substrate SUB100 and the second device unit D200.

The electronic device of FIGS. 9, 10 and 11 may be a flexible device, a foldable device, or a stretchable device, and the wiring members W100 or W110 may be flexible wiring, foldable wiring, or stretchable devices. When the electronic device is a stretchable device, the electronic device may undergo a strain (e.g., a tensile strain) equal to or greater than about 5% or about 10%. The strain (e.g., a tensile strain) of the electronic device may also be equal to or greater than about 50% or about 100%. Since the wiring members W100 or W110 may have high flexibility, bendability, and reliability (e.g., self-healing characteristics) as described with reference to FIGS. 3 through 8, the electronic device may have high flexibility/foldability/stretchability. Accordingly, according to an example embodiment, a flexible/foldable/stretchable device having excellent performance may be achieved.

Although attempts have been made to improve the flexibility of a wiring member through the use of metal wiring (e.g., a Au, Ag, or Cu wiring) having a meandering shape, since cracks often occur due to repeated deformation of the metal wiring (e.g., the Au, Ag, or Cu wiring), the resistance value thereof may rapidly increase. Also, when the metal wiring (e.g., the Au, Ag, or Cu wiring) is designed to have a meandering shape (e.g., a zigzag shape or a serpentine shape) or a mesh shape, there are limitations in being able to obtain wiring having a fine pitch between electrodes and a high integration degree. Furthermore, when wiring is manufactured by using a conventional conductive polymer material including a polymer matrix, the electrical conductivity is much lower than that of the metal wiring (e.g., the Au, Ag, or Cu wiring).

However, according to example embodiments herein, a wiring member such as W100 or W110 having high flexibility, bendability, and reliability as well as a high electrical conductivity may be achieved. The wiring member W100 or W110 may have high electrical conductivity due to the electrical percolation characteristics of the liquid metal particles. Also, since the liquid metal particles are relatively freely deformed, the liquid metal particles may maintain a high electrical conductivity and may have a small change in resistance despite deformation of the wiring member W100 or W110. Also, even upon sharp bending or stretching, since an electrical connection between the liquid metal particles may be maintained as a result of the presence of nanofillers each having a high aspect ratio, an electronic device capable of enduring a high strain and while undergoing only a small change in resistance may be easily realized. In addition, when the wiring member W100 or W110 is damaged, since a liquid metal having fluidity may fill the damaged portion, excellent self-healing/self-recovery characteristics may be achieved. Accordingly, the wiring member W100 or W110 may be highly reliable. The wiring member W100 or W110 may have a linear shape as shown in FIGS. 9 through 11, and thus may be suitable for use in a device having a fine pitch and a high integration degree. However, the wiring member W100 or W110 may also have a non-linear shape. If necessary, the wiring member W100 or W110 may be bent on a plane and may have a meandering shape or a mesh shape. When the wiring member W100 or W110 is formed so as to have a meandering shape or a mesh shape, flexibility and reliability may be further improved.

Although the structure of the wiring member W10 of FIG. 3 or the structure of the wiring member W15 is shown as being applied to the entire wiring member W100 or W110 of FIGS. 9 through 11, if necessary the structure of the wiring member W10 or W15 according to an example embodiment may be applied to only a part of the wiring member W100 or W110. For example, the structure of the wiring member W10 or W15 according to an example embodiment may be applied to only a folding portion or a stretching portion of an electronic device, as shown in FIG. 12.

Figure 12:
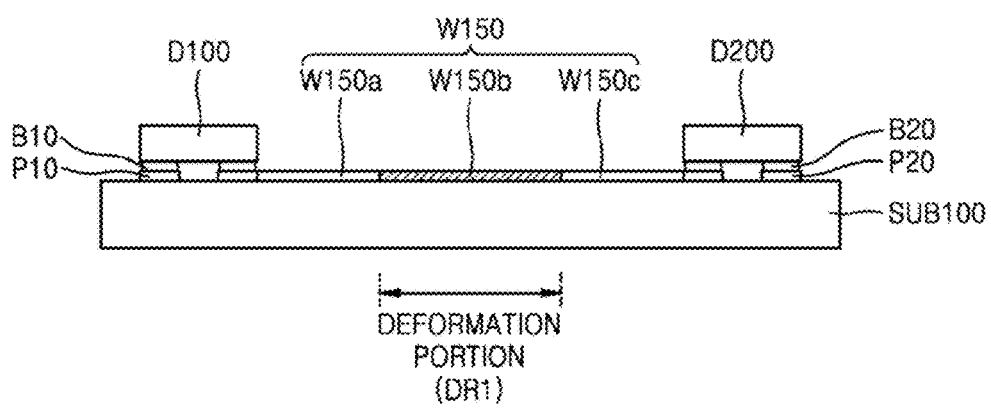
FIG. 12 is a cross-sectional view of an electronic device according to another example embodiment.

Referring to FIG. 12, at least one wiring member W150 may include a plurality of portions. For example, the wiring member W150 may include a first wiring portion W150a, a second wiring portion W150b, and a third wiring portion W150c. The second wiring portion W150b may be located between the first wiring portion W150a and the third wiring portion W150c. The first wiring portion W150a may be electrically connected to the first device unit D100, and the third wiring portion W150c may be electrically connected to the second device unit D200. The second wiring portion W150b may be provided so as to connect the first wiring portion W150a and the third wiring portion W150c. The second wiring portion W150b may have the structure of the wiring member W10 or W15 of FIGS. 3 through 8. Accordingly, the second wiring portion W150b may be flexible, foldable, and/or stretchable. The first wiring portion W150a and the third wiring portion W150c may be portions that are each formed from a general wiring material. For example, each of the first wiring portion W150a and the third wiring portion W150c may be formed from a general metal material or a composite material. The second wiring portion W150b of the device of FIG. 12 may be a foldable portion or a stretchable portion of wiring member W150. In other words, the second wiring portion W150b may be a deformable portion (i.e., a deformation portion DR1). Elements other than the wiring member W150 in FIG. 12 may be the same as those in FIG. 10.

Figure 13:
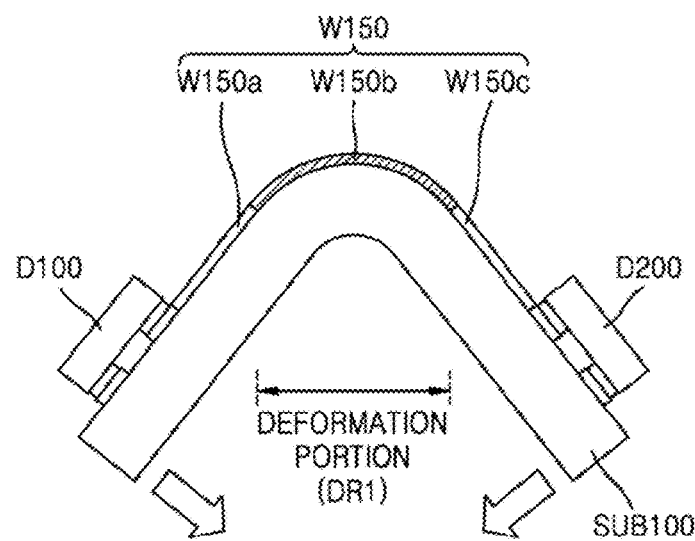
FIG. 13 is a cross-sectional view illustrating a case where the deformation portion of the electronic device of FIG. 12 is bent.
Figure 14:
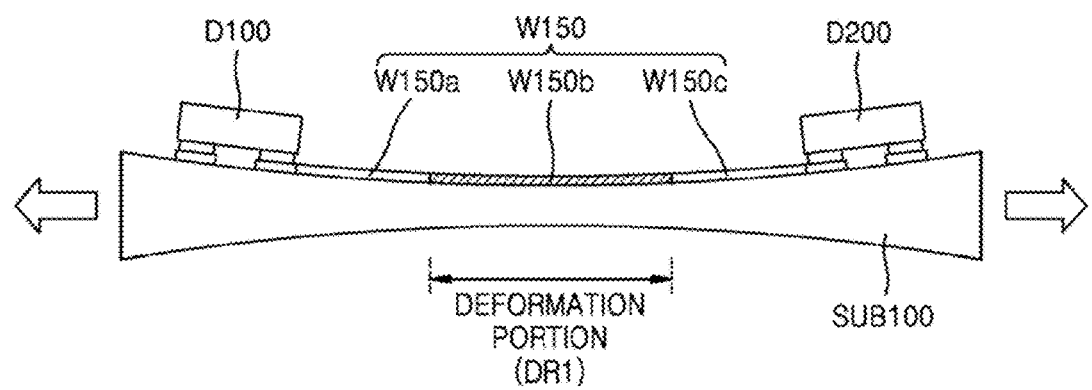
FIG. 14 is a cross-sectional view illustrating a case where the deformation portion of the electronic device of FIG. 12 is stretched.

FIG. 13 is a cross-sectional view illustrating an instance where the deformation portion DR1 of the electronic device of FIG. 12 is bent. FIG. 14 is a cross-sectional view illustrating an instance where the deformation portion DR1 of the electronic device of FIG. 12 is stretched. In order to obtain an electronic device that is to be partially deformed or has a relatively low strain, structures of FIGS. 12 through 14 may be used.

A wiring member or an electrode having a similar configuration to that of the wiring members according to example embodiments herein may be applied to any of various flexible/foldable/stretchable devices. The devices may be wearable devices. Also, the devices may be display devices or any of various semiconductor devices. Further, the wiring member or the electrode according to example embodiments herein may be applied to a wearable medical device (e.g., a sensor) or an energy-related product (e.g., a flexible/stretchable solar cell or battery). The wiring member or the electrode may also be applied to any of various other electronic devices and semiconductor devices.

FIGS. 15A through 15D are views showing a method of preparing paste according to an example embodiment. The method may be a method of preparing the paste 100 of FIG. 1.

Figure 15A:
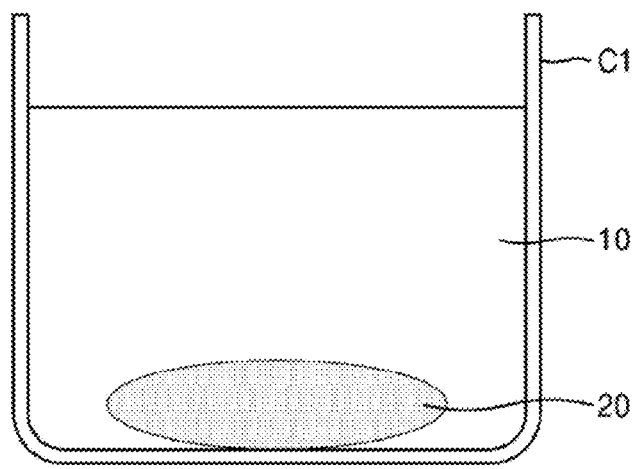
FIGS. 15A through 15D are views showing a method of preparing paste, according to an example embodiment.

Referring to FIG. 15A, a solution 10 including a polymer binder may be contained in the container C1. The solution 10 may be prepared by dissolving the polymer binder and a curing agent in a solvent. The polymer binder may include at least one of, for example, a silicone-based polymer, polyurethane, polyurethane acrylate, an acrylate polymer, an acrylate terpolymer, and epoxy. The silicon-based polymer may include at least one of, for example, polydimethylsiloxane, polyphenylmethylsiloxane, and hexamethyldisiloxane. The curing agent may be a material for curing the polymer binder under a specific condition. The curing agent is not particularly limited, and may include any of various curing agent materials used for a general polymer binder. The solvent is not particularly limited, and may be any of various organic solvents. For example, the solvent may be an alcohol-based solvent such as ethanol or methanol, a solvent such as acetone, or any of various other solvents.

A liquid metal 20 may be put into the solution 10. In this case, the liquid metal 20 may be a lump that is not dispersed in the solution 10. The liquid metal 20 may include at least one of, for example, Ga, a Ga—In alloy, a Ga—In—Sn alloy, and a Ga—In—Sn—Zn alloy.

Figure 15B:
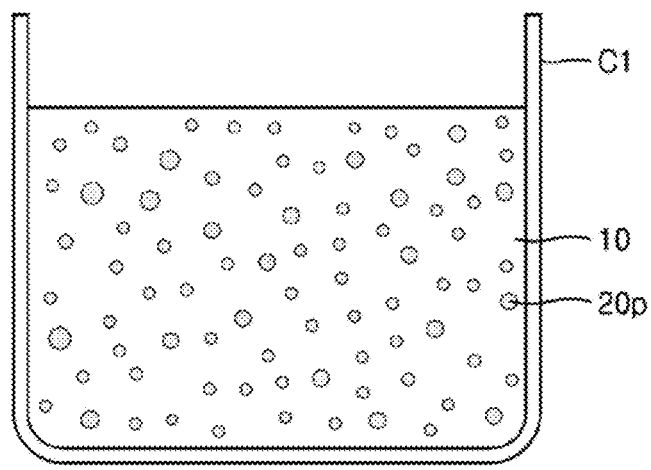

Referring to FIG. 15B, the liquid metal 20 in the solution 10 may be dispersed as a plurality of liquid metal particles 20p. The liquid metal 20 may be dispersed as the plurality of liquid metal particles 20p by using any of various methods. For example, the solution 10 including the liquid metal 20 may be stirred and/or agitated for a predetermined period of time, and then a sonication process may be performed on the solution 10. The stirring process may be performed for several minutes to several hours at speeds of hundreds of rpm to thousands of rpm. The sonication process may be performed for several minutes to several hours at predetermined power by using, for example, a sonication horn having a titanium probe. The liquid metal 20 may be dispersed as particles each having a relatively large size during the stirring process, and the particles each having a relatively large size may then be dispersed as the liquid metal particles 20p each having a small size during the sonication process. Also, liquid metal particles 20 having relatively uniform sizes may be produced during the sonication process. Each of the plurality of liquid metal particles 20p may have a size (e.g., a diameter) ranging, for example, from about 1 μm to tens of μm. The plurality of liquid metal particles 20p may be stably dispersed in the solution 10.

After the stirring process, if necessary, a solvent may be added to the solution 10, and then the sonication process may be performed. The viscosity of the solution 10 may be appropriately adjusted via the addition of the solvent. The added solvent may be the same as or similar to the solvent included in the solution 10 of FIG. 15A.

Figure 15C:
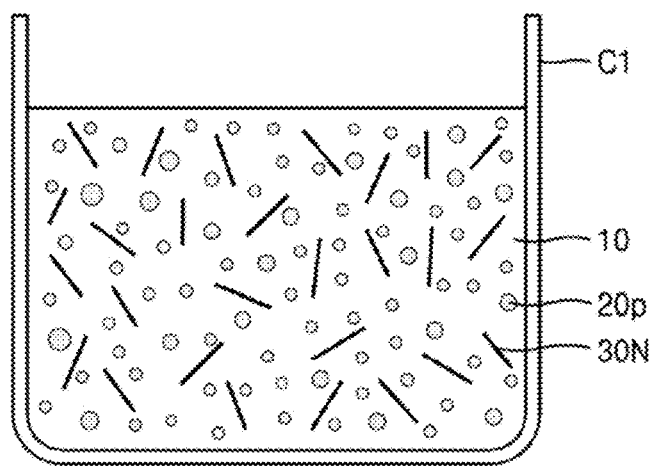

Referring to FIG. 15C, a plurality of nanofillers 30N may be added to the solution 10 in which the plurality of liquid metal particles 20p are dispersed. Each of the plurality of nanofillers 30N may have an aspect ratio equal to or greater than about 3. An aspect ratio of each of the plurality of nanofillers 30N may be equal to or greater than about 5 or about 10. For example, the plurality of nanofillers 30N may include at least one of CNTs, CNFs, graphene flakes, and metal nanowires. A content of the plurality of nanofillers 30N with respect to a total weight of the polymer binder, the plurality of liquid metal particles 20p, and the plurality of nanofillers 30N in the solution 10 may be equal to or less than about 5 wt % or about 3 wt %. For example, the content of the plurality of nanofillers 30N may range from about 0.5 wt % to about 3 wt %. When the content of the plurality of nanofillers 30N is extremely high, the viscosity may rapidly increase and the subsequent process of forming a wiring using paste 100A of FIG. 15D may not be easily performed.

When the content of the plurality of nanofillers 30N is equal to or greater than about 1 wt %, a mechanical dispersion process may be performed on the solution 10 including the polymer binder, the plurality of liquid metal particles 20p, and the plurality of nanofillers 30N. As an example, the mechanical dispersion process may be performed by using a roll mill. For example, the mechanical dispersion process may be performed by using a three-roll mill. The plurality of nanofillers 30N may be well-dispersed in the solution 10 during the mechanical dispersion process.

Next, a drying process may be performed on the solution 10 that is a mixture of the polymer binder, the plurality of liquid metal particles 20p, and the plurality of nanofillers 30N. Through the drying process, the solvent existing in the solution 10 may be removed to some extent. The drying process may be performed at room temperature (e.g., about 25° C.) or at a temperature equal to or lower than about 100° C. The amount of the solvent remaining in the solution 10 may be adjusted by adjusting the temperature and time of the drying process. The structure obtained after the drying process is illustrated in FIG. 15D.

Figure 15D:
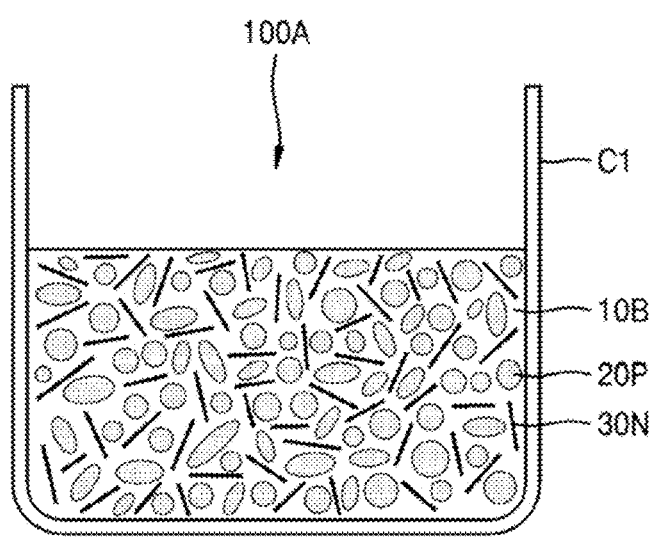

Referring to FIG. 15D, most of a solution 10B may be the polymer binder. Hereinafter, the solution 10B is referred to as the 'polymer binder'. The polymer binder 10B may exist as a solution or a gel. Accordingly, the polymer binder 10B may exist along with a predetermined solvent. Also, the polymer binder 10B may exist along with a curing agent. A plurality of liquid metal particles 20P that are mixed with the polymer binder 10B may be provided. Each of the plurality of liquid metal particles 20P may have a size (e.g., an average size) greater than that of each of the liquid metal particles 20p of FIG. 15C. At least some of the plurality of liquid metal particles 20p of FIG. 15C may be granulated so as to increase their diameter, and some from among the granulated liquid metal particles may be deformed so as to have elliptical shapes or elongated shapes similar to elliptical shapes. Accordingly, each of the plurality of liquid metal particles 20P of FIG. 15D may have a spherical shape, an elliptical shape, or an elongated shape similar to an elliptical shape. Accordingly, the plurality of liquid metal particles 20P may be suitable for obtaining electrical percolation characteristics. The plurality of nanofillers 30N that are mixed with the plurality of liquid metal particles 20P and the polymer binder 10B may be present. The plurality of nanofillers 30N may be uniformly (or substantially uniformly) mixed with the plurality of liquid metal particles 20P and the polymer binder 10B. The resulting structure, obtained by mixing the plurality of liquid metal particles 20P, the polymer binder 10B, and the plurality of nanofillers 30N, may be referred to as paste 100A.

The paste 100A of FIG. 15D may be the same as or substantially the same as the paste 100 of FIG. 1. The content of the plurality of liquid metal particles 20P with respect to the total weight of the plurality of liquid metal particles 20P and the polymer binder 10B may be equal to or greater than about 70 wt % or about 80 wt %, for example, from about 80 wt % to about 90 wt %. Also, the content of the plurality of nanofillers 30N with respect to the total weight of the plurality of liquid metal particles 20P, the polymer binder 10B, and the plurality of nanofillers 30N may be equal to or less than about 5 wt % or about 3 wt %, for example, from about 0.5 wt % to about 3 wt %.

Figure 16:
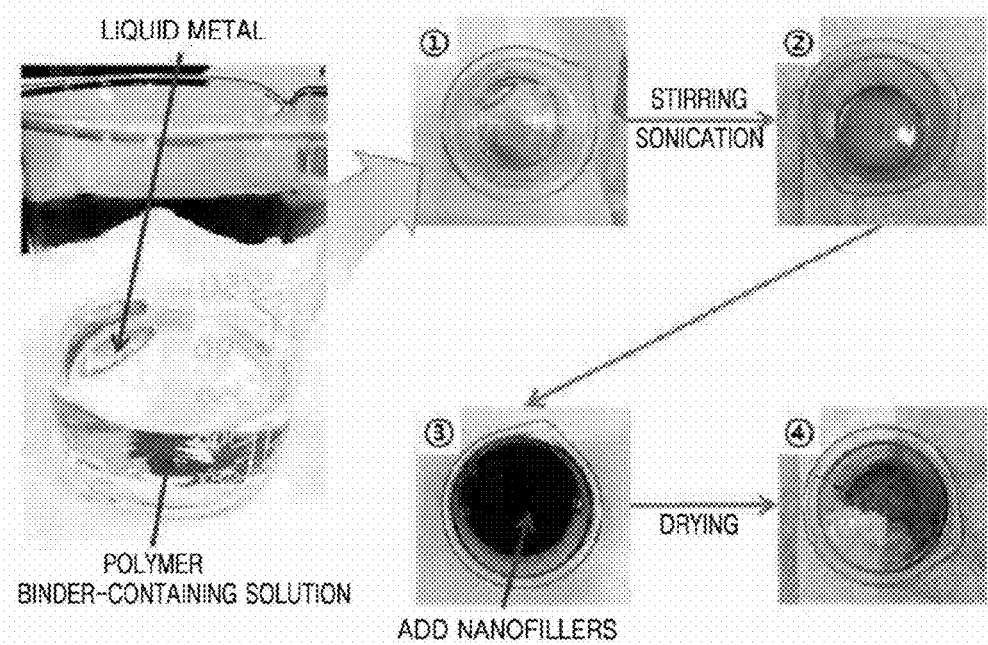
FIG. 16 is a series of pictures showing a process of preparing paste, according to an example embodiment.

FIG. 16 shows pictures illustrating a process of preparing paste according to an example embodiment.

Referring to FIG. 16, picture ① may correspond to the step of FIG. 15A. When viewing the left-enlarged picture of picture ①, a liquid metal was included in a solution containing a polymer binder. The solution containing the polymer binder may correspond to the solution 10 of FIG. 15A and the liquid metal may correspond to the liquid metal 20 of FIG. 15A.

Picture ② of FIG. 16 shows a structure obtained after liquid metal particles were dispersed in the solution via stirring and sonication processes. Picture ② may correspond to the step of FIG. 15B. If necessary, after the stirring process, a solvent may be added and then the sonication process may be performed.

Picture ③ of FIG. 16 shows a structure obtained after a plurality of nanofillers were added. Picture ③ may correspond to the step of FIG. 15C. After the nanofillers have been added, a mechanical dispersion process, for example, a three-roll mill process, may be performed.

Picture ④ of FIG. 16 shows a structure obtained after a drying process was performed on the mixture of picture ③. The material of picture ④ may correspond to the paste 100A of FIG. 15D.

Figure 17:
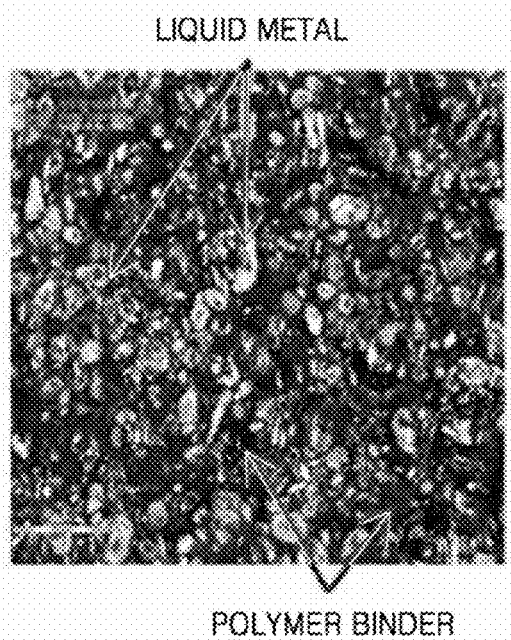
FIG. 17 is a laser microscope image of paste according to an example embodiment.
Figure 18:
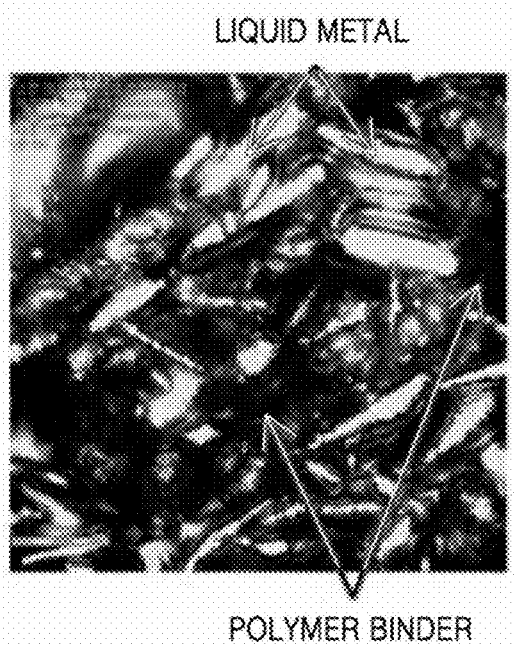
FIG. 18 is an enlarged laser microscope image illustrating a portion of FIG. 17.

FIG. 17 is a laser microscope image of paste according to an example embodiment. The paste of FIG. 17 is the material of picture ④ of FIG. 16. FIG. 18 is an enlarged laser microscope image illustrating a portion of FIG. 17.

Referring to FIGS. 17 and 18, liquid metal particles and a polymer binder were uniformly mixed with each other. Each of the liquid metal particles had a spherical shape, an elliptical shape, or the like. Although a plurality of nanofillers were included, the plurality of nanofillers were not easily recognized in the laser microscope images of FIGS. 17 and 18. The liquid metal particles were Ga, the polymer binder was PDMS, and the nanofillers were CNTs.

Figure 19:
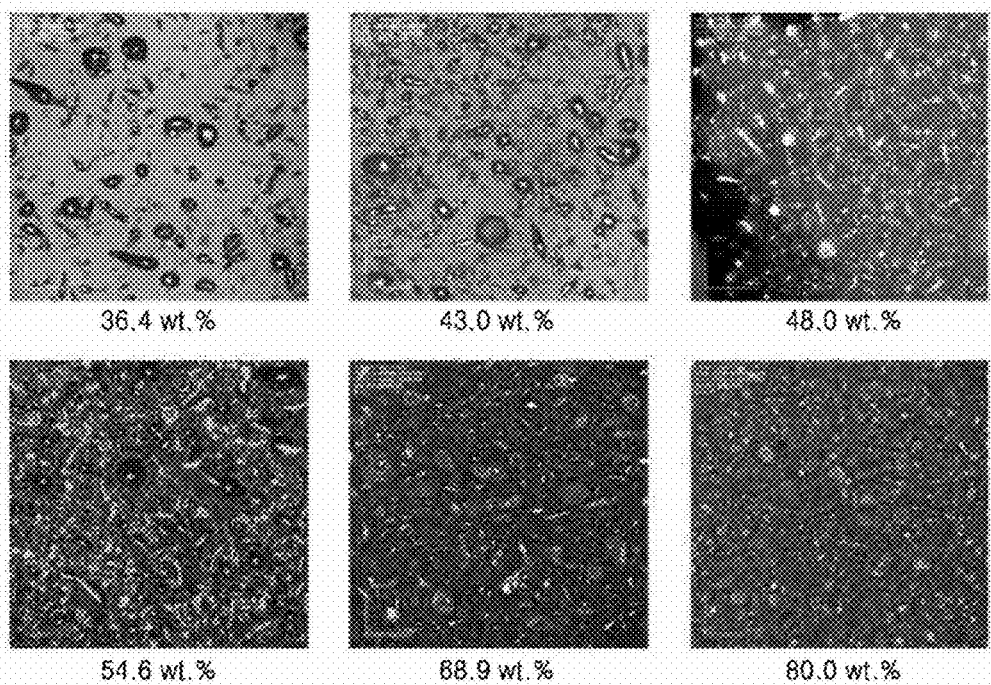
FIG. 19 shows laser microscope images illustrating the micro-structure of paste prepared by changing the content of liquid metal relative to the polymer binder.

FIG. 19 shows laser microscope images illustrating the micro-structure of paste prepared by changing the content of liquid metal relative to the polymer binder. The content refers to the content of the liquid metal with respect to the total weight of the polymer binder and the liquid metal. Nanofillers were not added and paste was prepared by changing the content of the liquid metal.

Referring to FIG. 19, as the content (wt %) of the liquid metal increased, electrical percolation characteristics caused by liquid metal particles being connected to or in contact with each other were obtained. It was found that when the content (wt %) of the liquid metal was equal to or greater than 80 wt %, the liquid metal particles may easily form a continuous conductive path. In other words, when the content (wt %) of the liquid metal is equal to or greater than about 70 wt % or about 80 wt %, electrical percolation characteristics may be easily obtained. In this regard, the content of the liquid metal with respect to the total weight of the polymer binder and the liquid metal in the paste according to an example embodiment may be equal to or greater than about 70 wt % or about 80 wt %.

Figure 20:
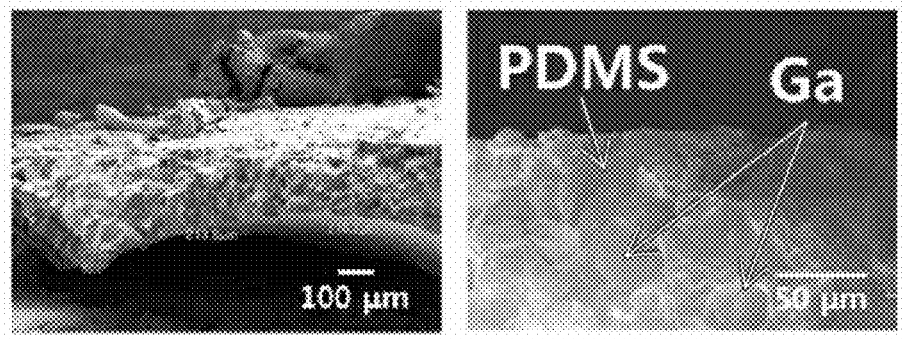
FIG. 20 shows scanning electron microscope (SEM) images illustrating a film formed by using paste, according to a comparative example.

FIG. 20 shows scanning electron microscope (SEM) images illustrating a film formed using a paste according to a comparative example. The left image is an SEM image illustrating the film taken at a side, and the right image is a cross-sectional SEM image illustrating a portion of the film taken at relatively high magnification. The paste according to the comparative example included liquid metal particles Ga and a polymer binder PDMS, and did not include nanofillers.

Referring to FIG. 20, the liquid metal particles Ga and the polymer binder PDMS were mixed in the film. In the right image, since the contrast between the liquid metal particles Ga and the polymer binder PDMS was not high, the boundary between the two materials may not be clear.

Figure 21:
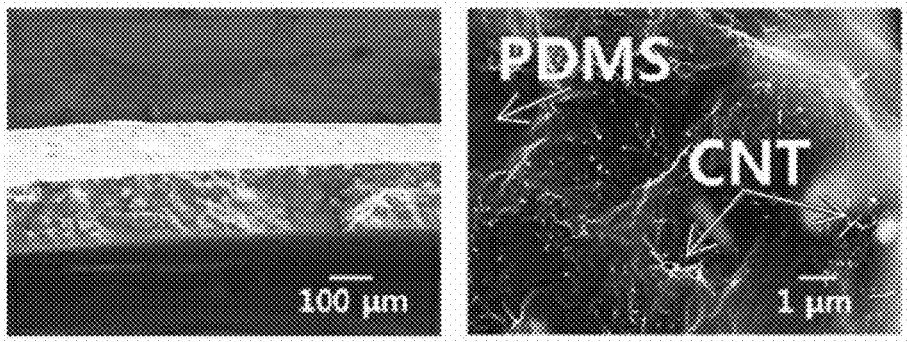
FIG. 21 shows SEM images of a film formed by using paste, according to an example embodiment.

FIG. 21 shows SEM images illustrating a film formed by using a paste according to an example embodiment. The left image is an SEM image illustrating the film taken at a side and the right image is an SEM image illustrating an upper portion of the film taken at high magnification. The paste according to the example embodiment included liquid metal particles of Ga, polymer binder PDMS, and nanofillers CNT. In this case, the content of the nanofillers CNT in the paste was about 2 wt %.

Referring to FIG. 21, the polymer binder PDMS and the nanofillers CNT were mixed in the film. The nanofillers CNT may be seen as white dots or lines, and the polymer binder PDMS may be seen as a black region. Although the liquid metal particles Ga existed, the liquid metal particles Ga and the polymer binder PDMS may not be clearly distinguished from each other in this image. In the right image of FIG. 21, the nanofillers CNT were uniformly dispersed in the film.

Figure 22:
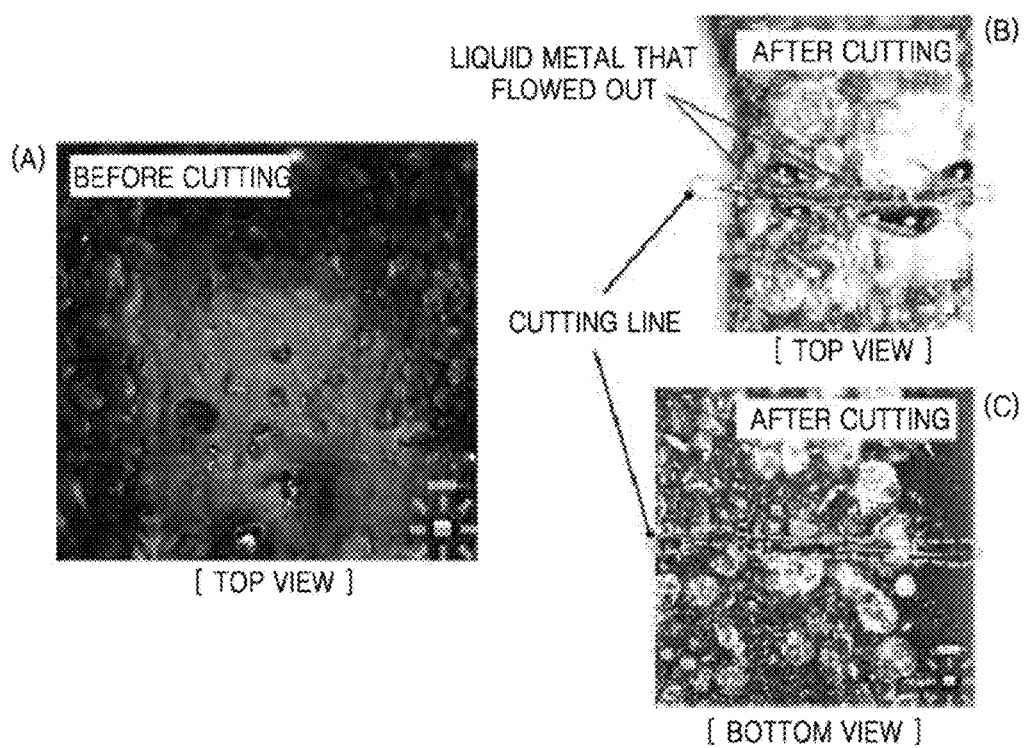
FIG. 22 includes laser microscope images showing a process in which wiring formed by using paste is damaged and the wiring undergoes self-healing (self-recovery), according to an example embodiment.

FIG. 22 shows laser microscope images showing a process in which a wiring member formed by using paste is damaged and the wiring undergoes self-healing (self-recovery), according to an example embodiment. A wiring member was formed by applying paste to a slide glass substrate, the wiring member was artificially cut, and the manner in which the cut portion (e.g., the cut line) was self-healed (self-recovered) was observed. Image A of FIG. 22 is a laser microscope image taken before the wiring member was cut, and images B and C are laser microscope images taken after the wiring member was cut. Image B shows a top surface of the wiring member and image C illustrates a bottom surface of the wiring member as seen through the slide glass substrate.

Referring to FIG. 22, the liquid metal flowed out along the cut portion (e.g., the cut line) and part of the liquid metal filled at least a part of the cut portion. Accordingly, even when part of the wiring member was damaged, the conductivity of the wiring member was self-healed (self-recovered). If necessary, self-healing and self-recovery may be expedited by applying predetermined heat or pressure to the wiring member (the cut portion of the wiring member). In this case, a cut portion of the polymer binder PDMS may also be healed and recovered.

Figure 23:
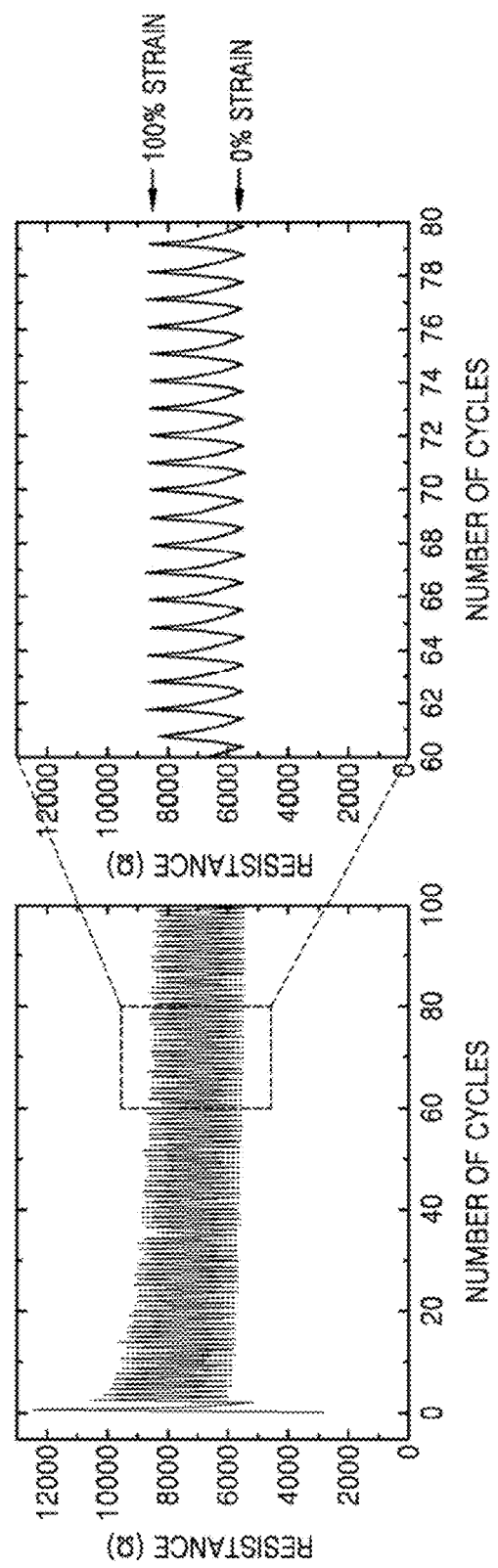
FIG. 23 shows graphs illustrating a result obtained after repeatedly performing a stretching test on a substrate structure including a wiring member, according to an example embodiment.

FIG. 23 contains graphs illustrating results obtained after repeatedly performing a stretching test on a substrate structure including a wiring member according to an example embodiment. The wiring member was formed on a polymer substrate by using paste according to an example embodiment, and a length L, a width W, and a thickness T of the wiring member were, respectively, 1 cm, 1 mm, and 0.5 mm. A change in resistance of the wiring member was measured by repeatedly stretching and releasing the polymer substrate in a longitudinal direction of the wiring member. In this case, a tensile strain was 100%. In the graphs of FIG. 23, the X-axis represents the number of stretching cycles and the Y-axis represents a resistance value (Ω) of the wiring. The right graph is an enlarged view of a portion of the left graph in which the number of stretching cycles ranged from 60 to 80.

Referring to FIG. 23, a portion in which the number of stretching cycles ranged from 1 to 20 may be a noise and stabilization portion. After the noise and stabilization portion, almost the same characteristics were obtained until the number of stretching cycles hit 100. Even after the stretching test was repeatedly performed, electrical characteristics of the wiring member were almost stable. Also, a difference, that is, ΔR, between a resistance value of the wiring member that was stretched and a resistance value of the wiring member that was released ranged from about 2.5 kΩ to about 3 kΩ, which is relatively small. When a tensile strain is less than 100%, the difference ΔR may be smaller. By repeatedly performing the stretching test, the stretchability and durability of the wiring member according to an example embodiment may be determined.

A wiring member or an electrode having a configuration similar to that of the wiring member according to example embodiments herein may be applied to any of various flexible/foldable/stretchable devices. The devices may be wearable devices. In addition, the devices may be display devices or any of various other semiconductor devices. Also, the wiring member or the electrode according to example embodiments herein may be applied to a wearable medical device (e.g., a sensor) or an energy-related product (e.g., a flexible/stretchable solar cell or a battery). In addition, the wiring member or the electrode may be applied to any of various other electronic devices and semiconductor devices. Further, a method of manufacturing an electronic device according to an example embodiment herein may include forming a device unit and forming a wiring structure electrically connected to the device unit, and the forming of the wiring structure may include preparing paste by using the method of FIGS. 15A through 15D, applying the paste to a substrate in a predetermined shape, and curing a polymer binder of the applied paste. The applying and curing of the paste may be the same as or similar to that described with reference to FIGS. 2A through 2C. Various electronic devices of FIGS. 9 through 14 may be manufactured by using the method.

While the present disclosure has been particularly shown and described with reference to example embodiments thereof, the example embodiments are provided for the purposes of illustration only, and it will be understood by one of ordinary skill in the art that various modifications and equivalent other embodiments can be made from the present disclosure. For example, it will be understood by one of ordinary skill in the art that paste, a method of manufacturing a wiring member by using the paste, and a material/structure/method of making a substrate structure including the wiring member described with reference to FIGS. 1, 2A through 2C, and 3 through 8 may be changed in various ways. Also, it will be understood that the structure of an electronic device described with reference to FIGS. 9 through 14 may be changed in various ways. For example, various electrodes and connection members may be formed by using paste according to an example embodiment and an electronic device including the various electrodes and connection members may be obtained. Also, it will be understood by one of ordinary skill in the art that the method of preparing paste described with reference to FIGS. 15A through 15D may be changed in various ways. Accordingly, the true technical scope of the present disclosure is defined by the technical spirit of the appended claims.

What is claimed is:

1. A paste material comprising:
   a plurality of liquid metal particles that are liquid at 25° C.;
   a polymer binder mixed with the plurality of liquid metal particles; and
   a plurality of nanofillers mixed with the plurality of liquid metal particles and the polymer binder and each having an aspect ratio equal to or greater than 3,
   wherein a weight percent of the plurality of liquid metal particles is greater than a weight percent of the polymer binder and is greater than a weight percent of the plurality of nanofillers.

2. The paste material of claim 1, wherein a weight percent of the plurality of liquid metal particles with respect to a total weight of the plurality of liquid metal particles and the polymer binder is equal to or greater than 80 wt %.

3. The paste material of claim 1, wherein a weight percent of the plurality of nanofillers with respect to a total weight of the plurality of liquid metal particles, the polymer binder, and the plurality of nanofillers is equal to or less than 3 wt %.

4. The paste material of claim 1, wherein the plurality of liquid metal particles comprise at least one selected from the group consisting of gallium (Ga), a gallium-indium (Ga—In) alloy, a gallium-indium-tin (Ga—In—Sn) alloy, and a gallium-indium-tin-zinc (Ga—In—Sn—Zn) alloy.

5. The paste material of claim 1, wherein each of the plurality of liquid metal particles has a spherical shape or an elliptical shape, and
   a diameter or a length of each of the plurality of liquid metal particles is from several μm to hundreds of μm.

6. The paste material of claim 1, wherein the plurality of nanofillers comprise at least one selected from the group consisting of carbon nanotubes, carbon nanofibers, graphene flakes, and metal nanowires.

7. The paste material of claim 1, wherein the polymer binder comprises at least one selected from the group consisting of a silicon-based polymer, polyurethane, polyurethane acrylate, an acrylate polymer, an acrylate terpolymer, and epoxy, and wherein the silicon-based polymer optionally comprises at least one from among polydimethylsiloxane, polyphenylmethylsiloxane, and hexamethyldisiloxane.

8. The paste material of claim 7, wherein the polymer binder comprises at least one selected from the group consisting of polydimethylsiloxane, polyphenylmethylsiloxane, and hexamethyldisiloxane.

9. The paste material of claim 8, wherein the weight percent of the plurality of liquid metal particles is 80-90 weight percent based on a total weight of the polymer binder and the liquid metal particles; and the weight percent of the plurality of nanofillers is 0.5-3 weight percent based on a total weight of the polymer binder, the liquid metal particles, and the nanofillers.

10. The paste material of claim 9, wherein a total of the weight percent of the liquid metal particles, the weight percent of the polymer binder, and the weight percent of the plurality of nanofillers is 100 weight percent of the paste material.

11. The paste material of claim 1, wherein at least one of the plurality of liquid metal particles is a self-healing particle.

12. An electronic device comprising an electrical connection member formed from the paste material of claim 1.

13. An electronic device comprising:
   a device unit; and
   a wiring member electrically connected to the device unit, wherein the wiring member comprises:
   a plurality of liquid metal particles that are liquid at 25° C.;
   a polymer binder mixed with the plurality of liquid metal particles; and
   a plurality of nanofillers mixed with the plurality of liquid metal particles and the polymer binder, each of the plurality of nanofillers having an aspect ratio equal to or greater than 3,
   wherein at least some of the plurality of liquid metal particles contact each other and at least some of the plurality of nanofillers contact at least some of the plurality of liquid metal particles, and
wherein a weight percent of the plurality of liquid metal particles is greater than a weight percent of the polymer binder and is greater than a weight percent of the plurality of nanofillers.

14. The electronic device of claim 13, wherein the electronic device is a flexible device, a foldable device, or a stretchable device, and the wiring member is a flexible wiring, a foldable wiring, or a stretchable wiring.

15. The electronic device of claim 13, wherein a content of the plurality of liquid metal particles with respect to a total weight of the plurality of liquid metal particles and the polymer binder is equal to or greater than 80 wt %.

16. The electronic device of claim 13, wherein a content of the plurality of nanofillers with respect to a total weight of the plurality of liquid metal particles, the polymer binder, and the plurality of nanofillers is equal to or less than 3 wt %.

17. The electronic device of claim 13, wherein the plurality of liquid metal particles comprise at least one selected from the group consisting of gallium (Ga), a gallium-indium (Ga—In) alloy, a gallium-indium-tin (Ga—In—Sn) alloy, and a gallium-indium-tin-zinc (Ga—In—Sn—Zn) alloy.

18. The electronic device of claim 13, wherein the plurality of nanofillers comprise at least one selected from the group consisting of carbon nanotubes (CNTs), carbon nanofibers (CNFs), graphene flakes, and metal nanowires.

19. The electronic device of claim 13, wherein at least one of the plurality of liquid metal particles is a self-healing particle.

20. The electronic device of claim 13, wherein the wiring member has an electrical conductivity equal to or greater than 100 S/m.

21. The electronic device of claim 13, wherein the plurality of liquid metal particles form a continuous conductive path from one end to another end of the wiring member in a longitudinal direction of the wiring member.

22. The electronic device of claim 13, wherein the wiring member comprises a first layer region and a second layer region,
wherein the plurality of liquid metal particles in the first layer region has a first density, and
the plurality of liquid metal particles in the second layer region has a second density that is less than the first density.

23. A method of preparing paste, the method comprising:
preparing a solution comprising a polymer binder;
dispersing a plurality of liquid metal particles in the solution, the plurality of liquid metal particles being liquid at 25° C.;
adding to the solution, either before or after the dispersing of the plurality of liquid metal particles, a plurality of nanofillers each having an aspect ratio equal to or greater than 3; and
drying a mixed solution comprising the polymer binder, the plurality of liquid metal particles, and the plurality of nanofillers,
wherein a weight percent of the plurality of liquid metal particles is greater than a weight percent of the polymer binder and is greater than a weight percent of the plurality of nanofillers.

24. The method of claim 23, wherein the dispersing of the plurality of liquid metal particles in the solution comprises:
putting a liquid metal into the solution;
stirring the solution in which the liquid metal is included; and
performing sonication on the solution.

25. The method of claim 23 further comprising, after the adding of the plurality of nanofillers to the solution, performing mechanical dispersion on the solution.

26. The method of claim 25, wherein the mechanical dispersion is performed by using a roll mill.

27. The method of claim 23, wherein a content of the plurality of liquid metal particles with respect to a total weight of the plurality of liquid metal particles and the polymer binder is equal to or greater than 80 wt %.

28. The method of claim 23, wherein a content of the plurality of nanofillers with respect to a total weight of the plurality of liquid metal particles, the polymer binder, and the plurality of nanofillers is equal to or less than 3 wt %.

29. The method of claim 27, wherein a content of the plurality of nanofillers with respect to a total weight of the plurality of liquid metal particles, the polymer binder, and the plurality of nanofillers is equal to or less than 3 wt %.

30. A method of manufacturing an electronic device, the method comprising:
forming a device unit; and
forming a wiring structure electrically connected to the device unit,
wherein the forming of the wiring structure comprises:
preparing paste by using the method of claim 23;
applying the paste to a substrate in a predetermined shape; and
curing the polymer binder in the applied paste.

31. A paste material comprising:
a plurality of liquid metal particles that are liquid at 25° C.;
a polymer binder mixed with the plurality of liquid metal particles; and
a plurality of nanofillers mixed with the plurality of liquid metal particles and the polymer binder and each having an aspect ratio equal to or greater than 3,
wherein a weight percent of the plurality of nanofillers with respect to a total weight of the plurality of liquid metal particles, the polymer binder, and the plurality of nanofillers is equal to or less than 3 wt %.

* * * * *